US 6,720,245 B2

(12) United States Patent
Stucchi et al.

(10) Patent No.: US 6,720,245 B2
(45) Date of Patent: Apr. 13, 2004

(54) METHOD OF FABRICATION AND DEVICE FOR ELECTROMAGNETIC-SHIELDING STRUCTURES IN A DAMASCENE-BASED INTERCONNECT SCHEME

(75) Inventors: Michele Stucchi, Leuven (BE); Karen Maex, Herent (BE); David De Roest, Brugge (BE)

(73) Assignee: Interuniversitair Microelektronica Centrum (IMEC), Leuven (BE)

( * ) Notice: Subject to any disclaimer, the term of this patent is extended or adjusted under 35 U.S.C. 154(b) by 0 days.

(21) Appl. No.: 09/948,370

(22) Filed: Sep. 6, 2001

(65) Prior Publication Data

US 2002/0102835 A1 Aug. 1, 2002

Related U.S. Application Data

(60) Provisional application No. 60/230,729, filed on Sep. 7, 2000.

(51) Int. Cl.[7] ............................................. H01L 21/44
(52) U.S. Cl. ..................... 438/614; 438/619; 438/637; 257/758; 257/773
(58) Field of Search ................................. 438/618, 622, 438/631, 637, 422, 614, 633, 666, 430, 619; 257/758, 773

(56) References Cited

U.S. PATENT DOCUMENTS 5,363,550 A * 11/1994 Aitken et al. ................. 29/828
6,022,787 A * 2/2000 Ma .............................. 438/422
6,060,388 A * 5/2000 Akatsu et al. ............... 438/637
6,281,121 B1   8/2001 Brown et al.
6,388,198 B1 * 5/2002 Bertin et al. ................. 174/251

FOREIGN PATENT DOCUMENTS

| WO | WO 00/45420 | 8/2000 |
| WO | WO 01/31706 | 5/2001 |

OTHER PUBLICATIONS

Gardner, D., et al., "Embedded ground planes using sidewall insulators for high frequency interconnects in integrated circuits", IEDM Conference of 1993, pp. 251–254, (1993).
Havemann, R., et al., "Overview of process integration issues for low–k dielectrics" Material Research Society, vol. 511, pp. 3–15, (1998).
Thomas, M., et al., "VLSI multilevel micro–coaxil interconnects for high speed devices", IEDM Conference of 1990, pp 55–58, (1990).

* cited by examiner

Primary Examiner—Caridad Everhart
(74) Attorney, Agent, or Firm—Knobbe, Martens, Olson & Bear, LLP.

(57) ABSTRACT

A shielded interconnect and a method of manufacturing a shielded interconnect implemented in a damascene back-end-of-line technology to form electromagnetically shielded interconnects. The standard metallization of the damascene technology is used as a core layer in a coaxial interconnect line. Prior to filling the via and trench openings in the damascene stack with this standard metallization, conductive and dielectric layers are formed as shield and insulator layers, respectively, of the coaxial interconnect line.

20 Claims, 21 Drawing Sheets

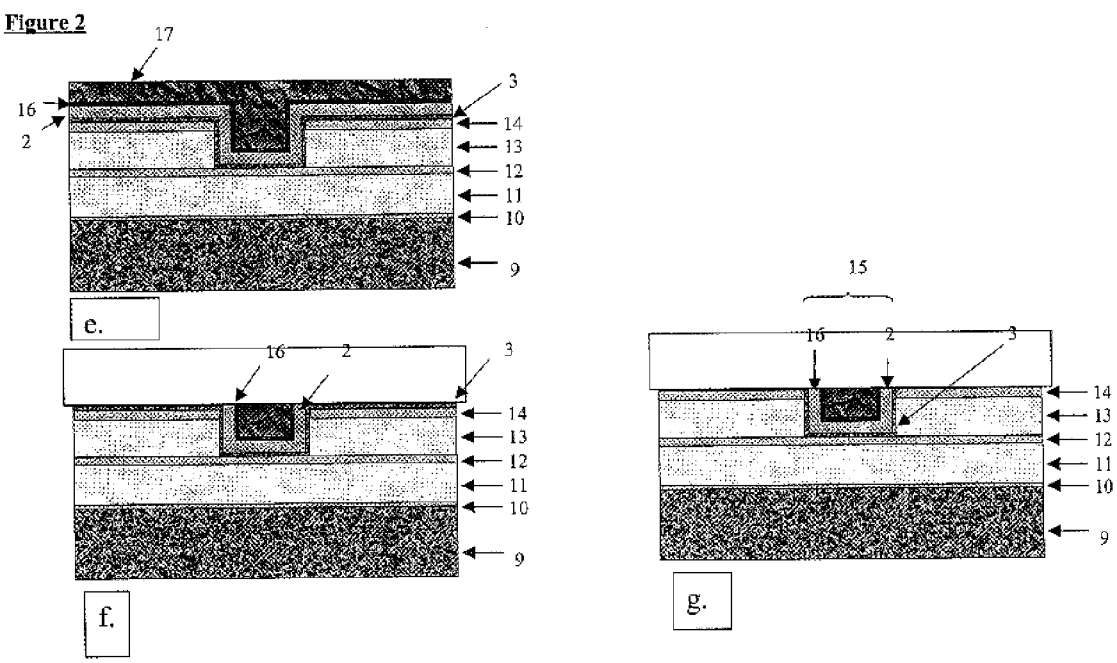

a.    b.

Figure 3
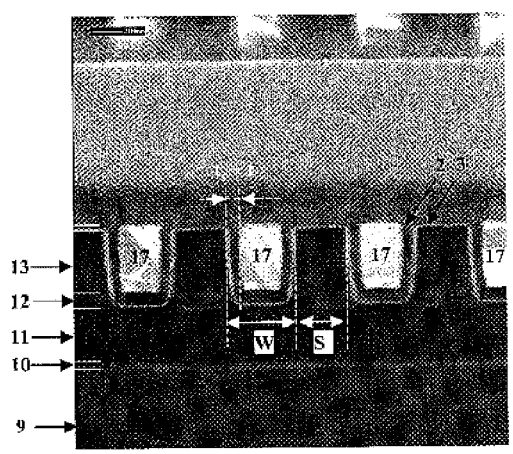
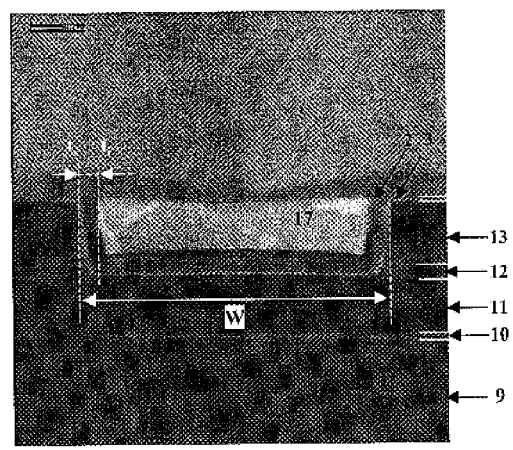
c.                    d.

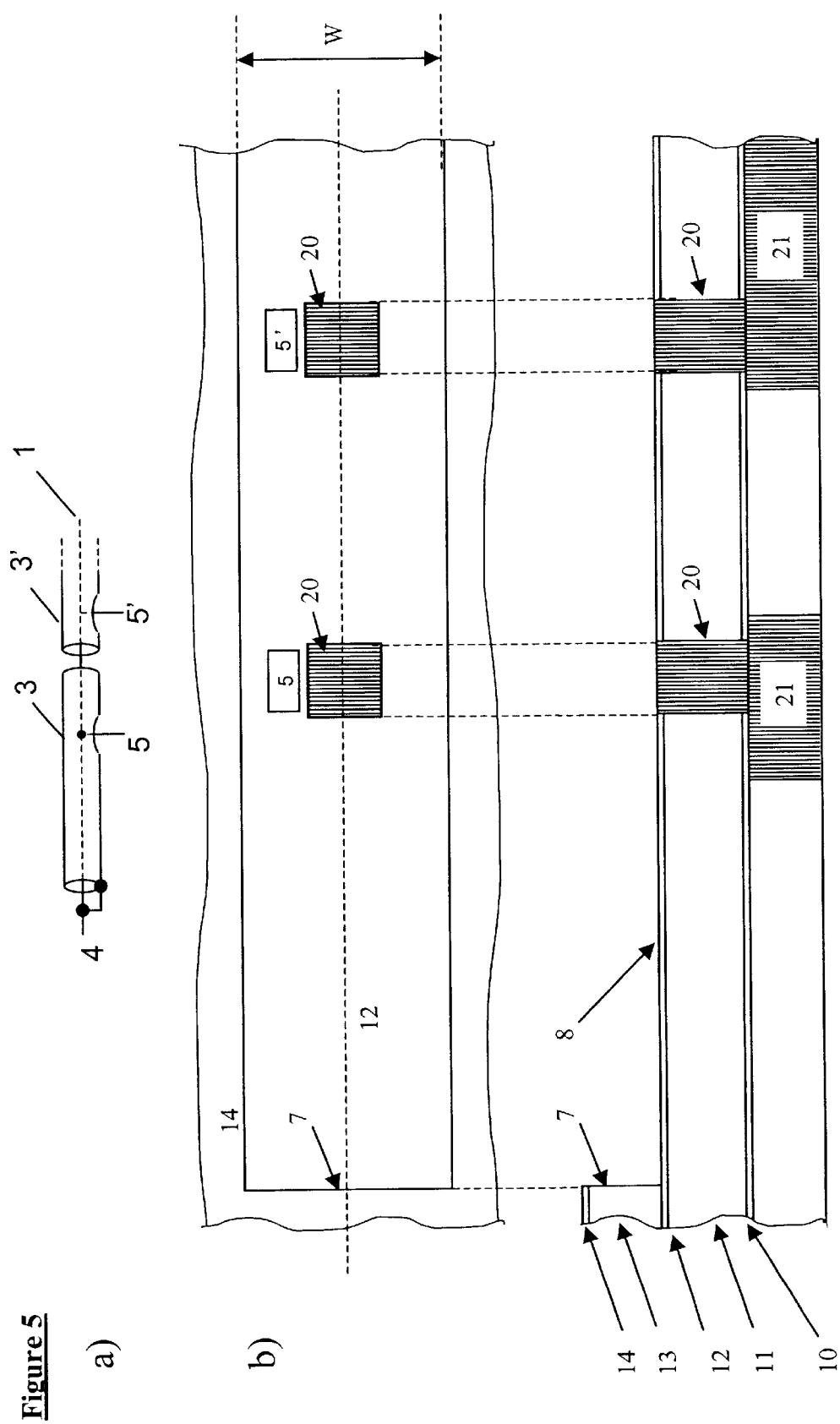

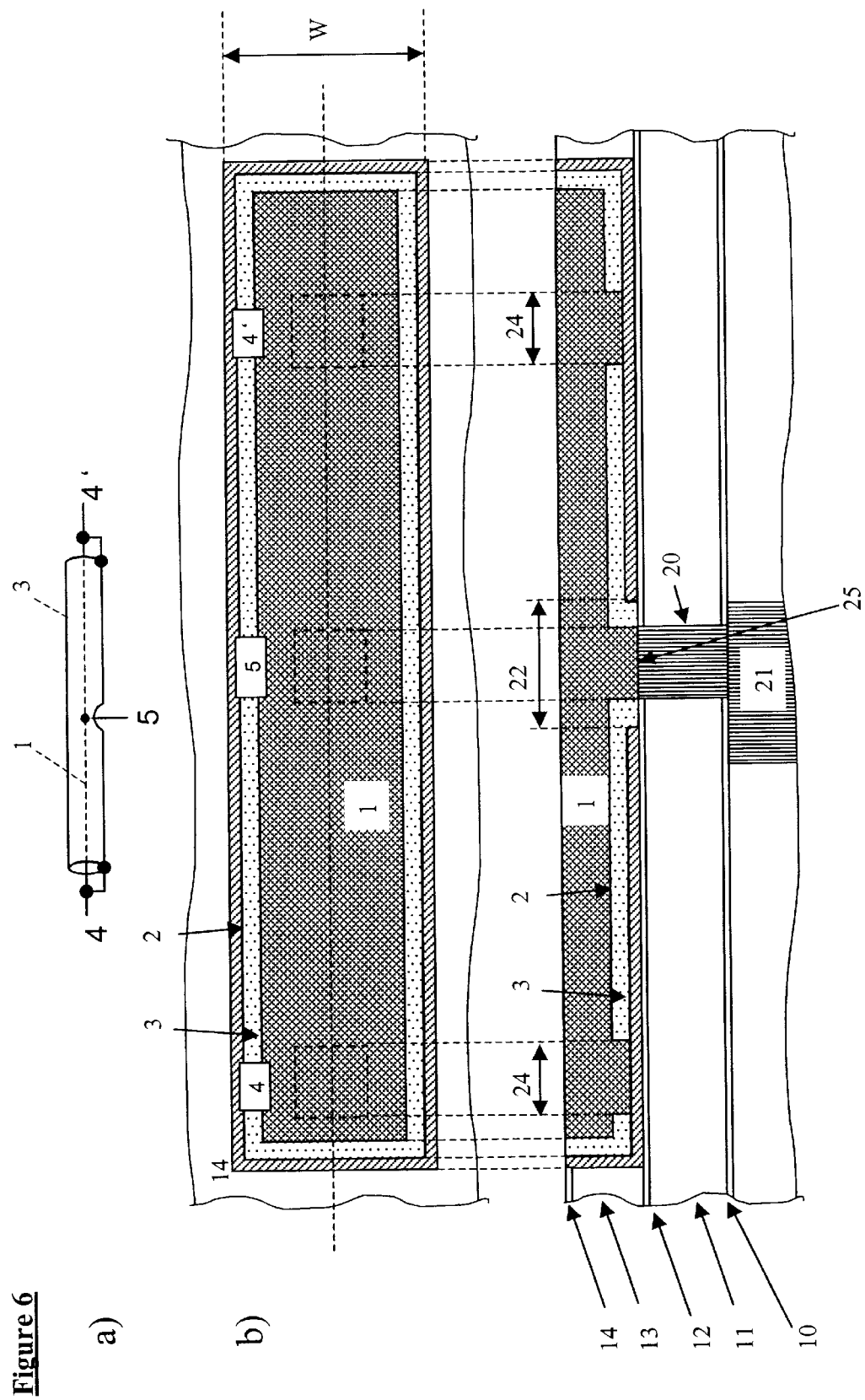

c)

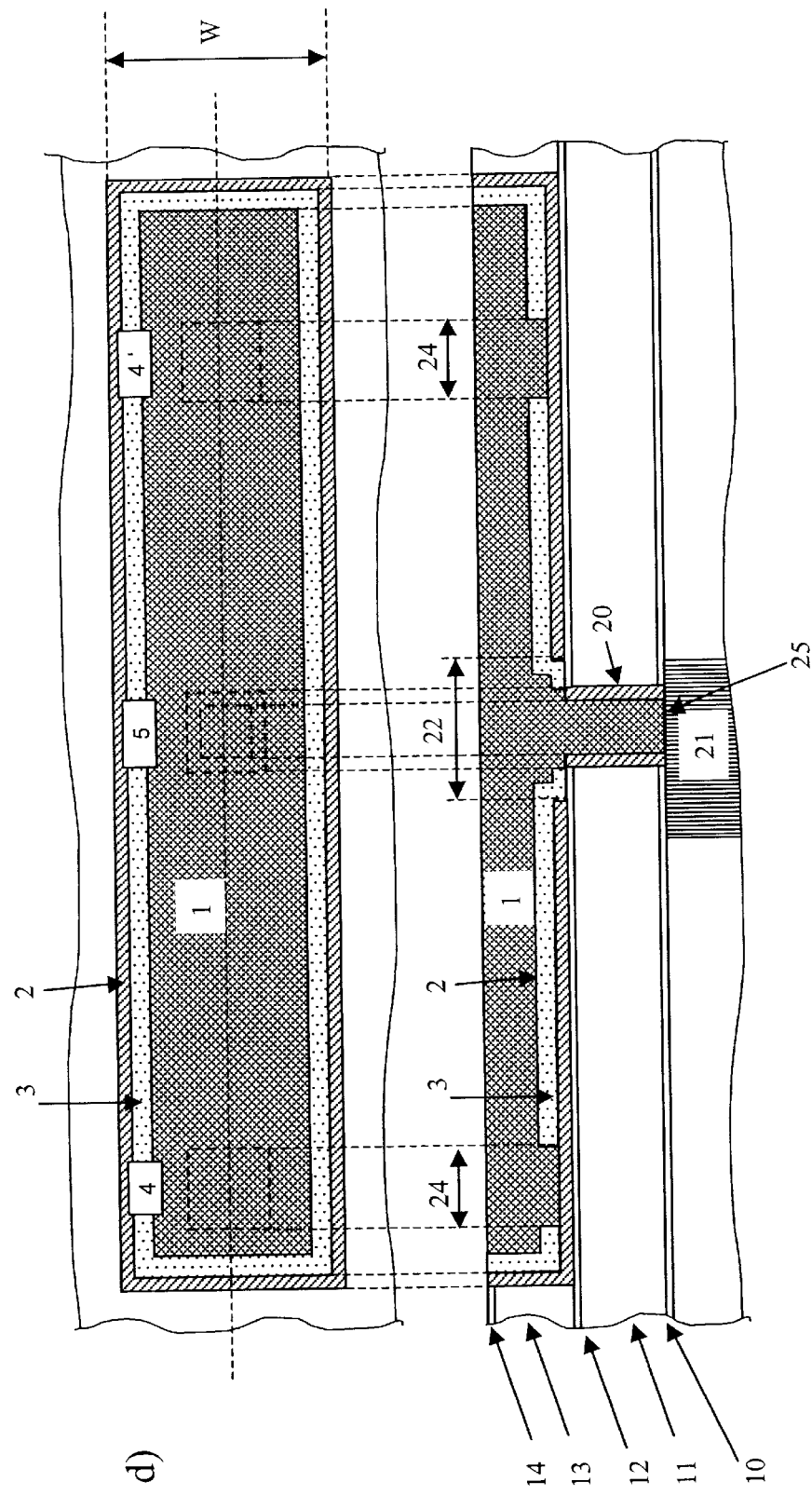

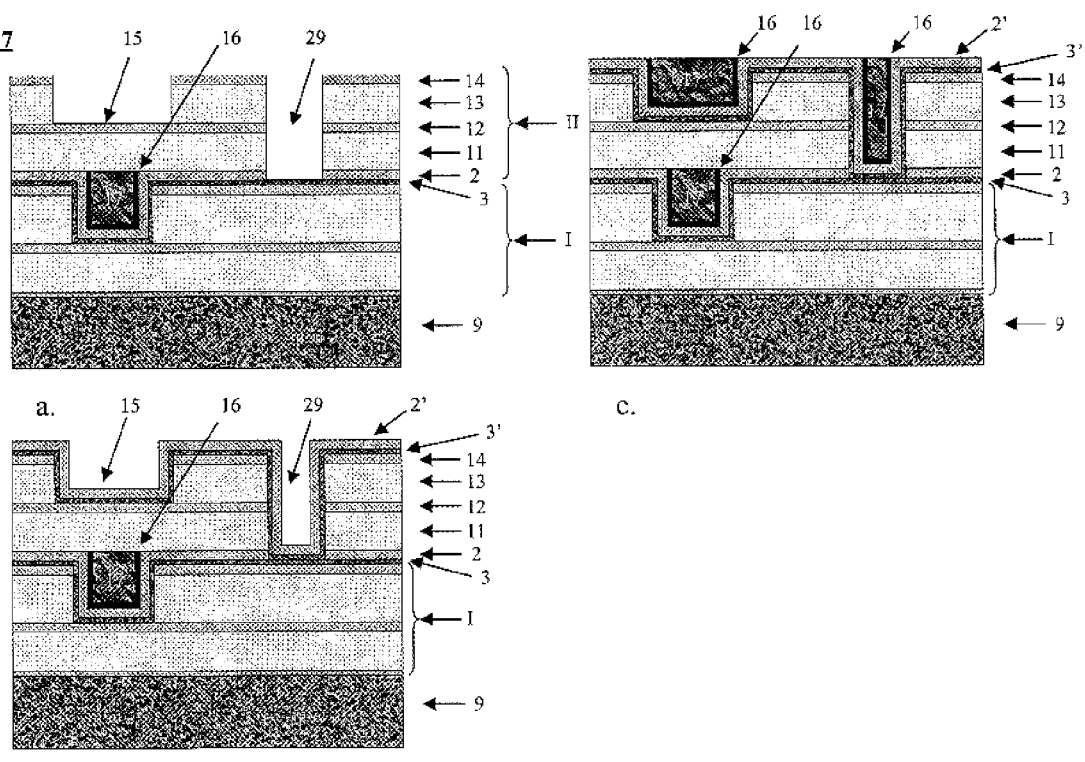

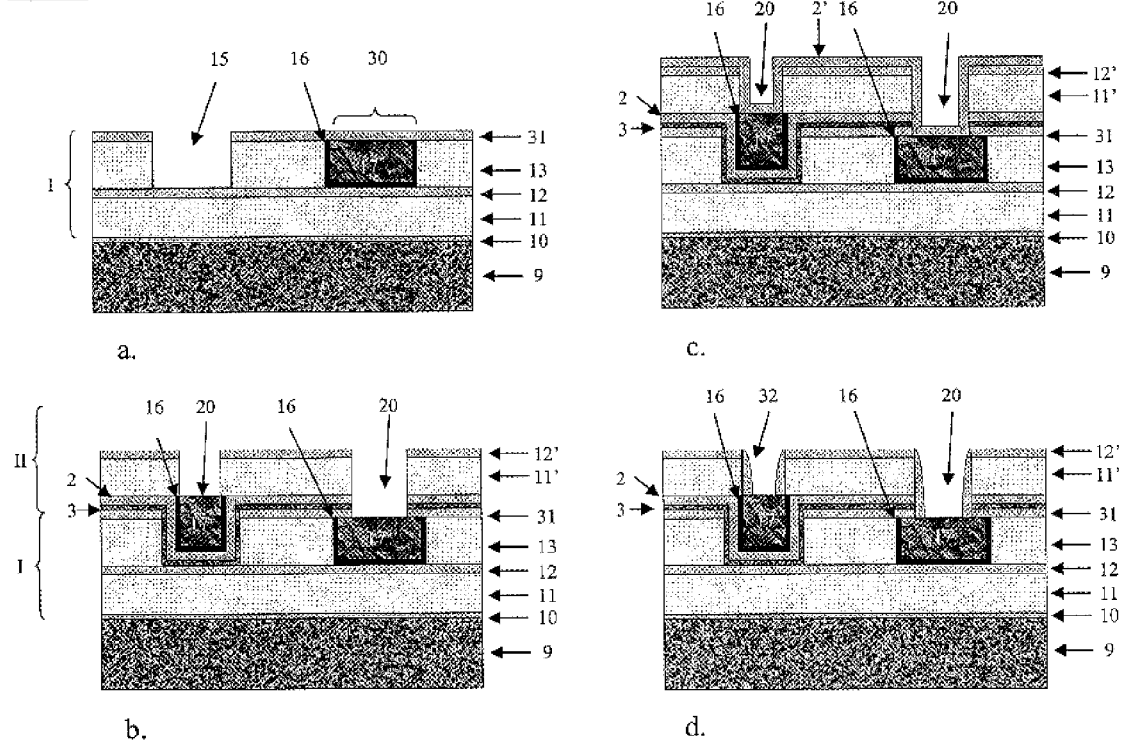

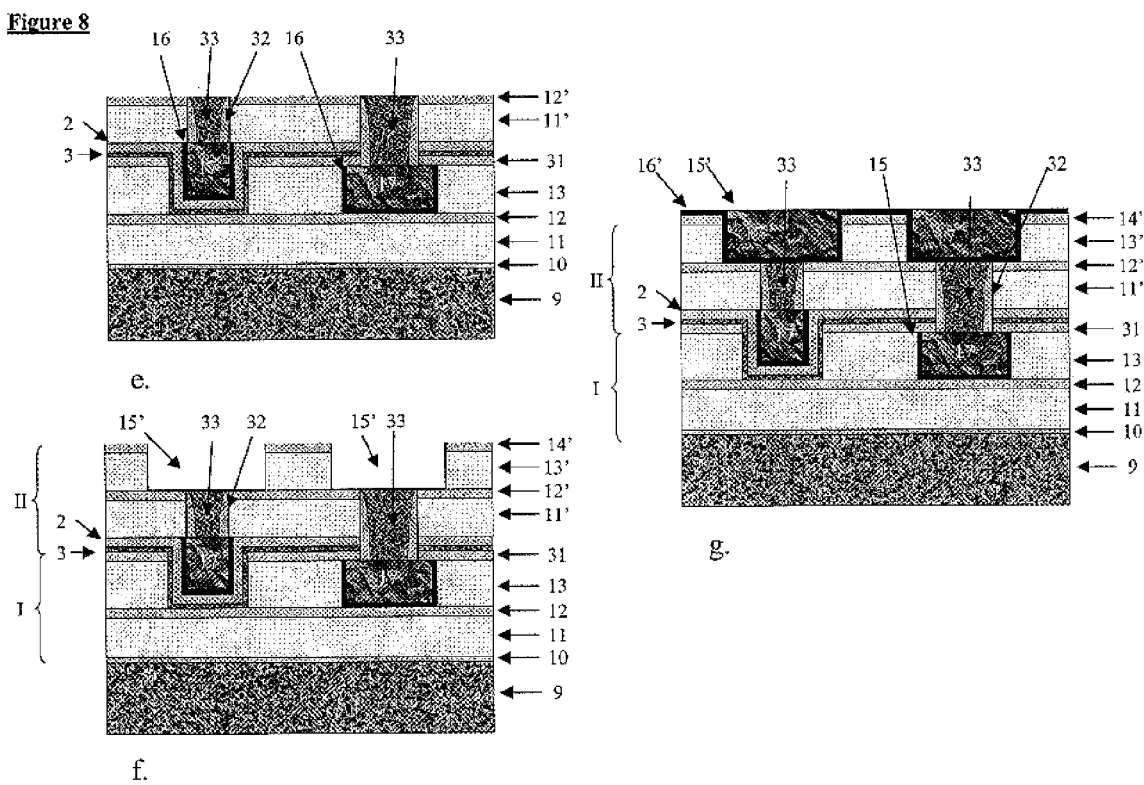

Figure 9
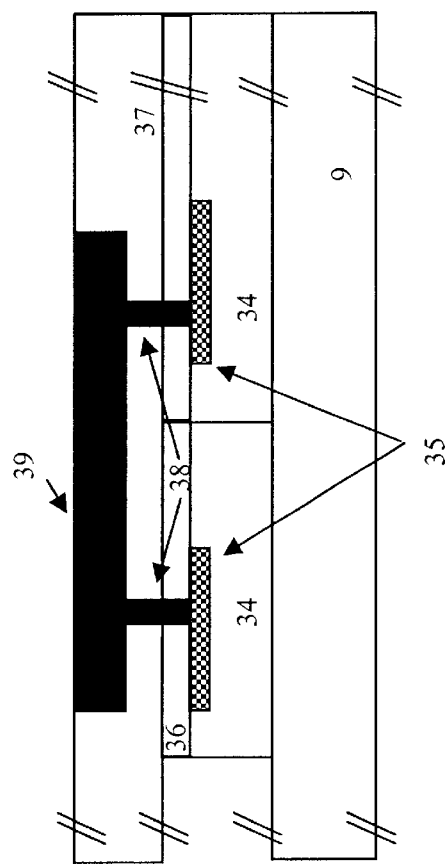
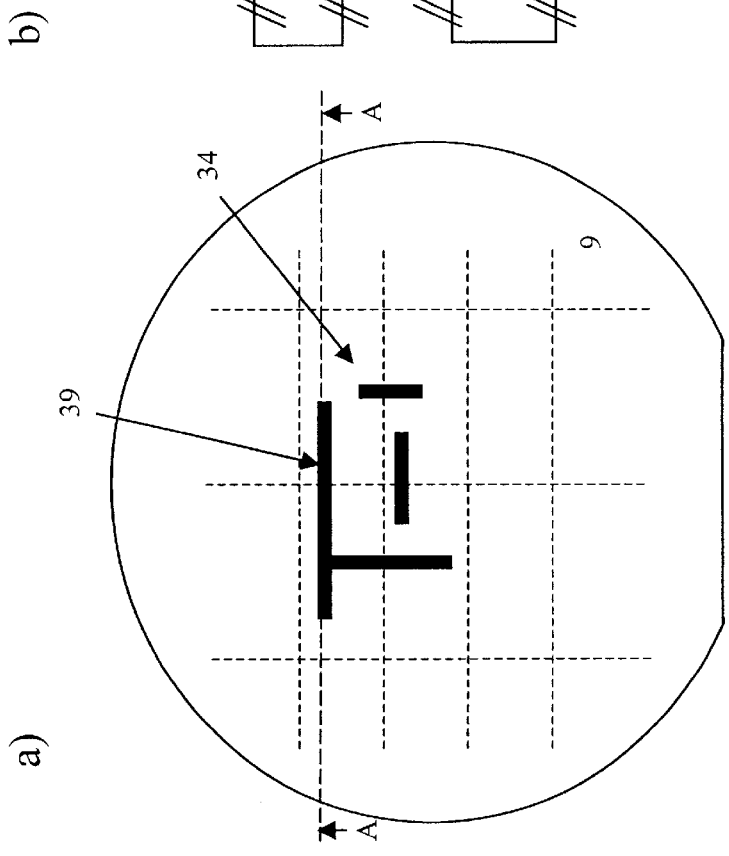

METHOD OF FABRICATION AND DEVICE FOR ELECTROMAGNETIC-SHIELDING STRUCTURES IN A DAMASCENE-BASED INTERCONNECT SCHEME

This application claims priority to U.S. provisional patent application entitled "SHIELDED IC INTERCONNECTS", having application Ser. No. 60/230,729, and filed on Sep. 7, 2000.

BACKGROUND OF THE INVENTION

1. Field of the Invention

The present invention relates generally to methods of manufacturing and devices for interconnects in integrated semiconductor circuits. More particularly, the invention relates to methods of fabricating and devices for electromagnetic shielded interconnects. These devices are implemented in a damascene process flow.

2. Description of the Related Art

The increasing operation frequency of state-of-the-art VLSI circuits is nowadays mainly limited by the speed at which electromagnetic (EM) signals can be conveyed from one high speed building block to another building block on the semiconductor chip. These high frequency signals are being transmitted through an interconnect scheme comprising multiple levels of, typically metallic, conductors spaced apart and electrically isolated in lateral and vertical direction by layers of dielectric materials. These interconnect planes or levels can be interconnected in vertical direction by "vias" or openings formed in the surrounding dielectrics and filled with a conductive material.

In semiconductor process technology fundamental two interconnect fabrication options exist: substructive etch of metal or the damascene approach. In the first process option each interconnect level is formed by first depositing metal on top of a dielectric layer belonging to a lower interconnect level, then patterning metal lines and covering this metal pattern with a layer of dielectric, the so-called inter-metal dielectric (IMD). In this IMD layer openings, i.e. contact or "via", to the underlying metal pattern are defined and finally these openings in the dielectric layer are filled with a metal. In the last process option each interconnect level is formed by first depositing and planarizing the dielectric material (IMD) followed by the etching of openings in this dielectric stack. These openings and serve as molds for the via and trench pattern. Finally the openings, grooves or indents are filled with metal. In the single damascene process the damascene process sequence is repeated to pattern and metallize respectively the opening and trench, while in the dual damascene process both opening and trench are patterned and metallized together. The damascene option is the preferred back-end-of-line process sequence for manufacturing advanced semiconductor chips. A comparison between these two interconnect architectures is given in "Overview of process integration issues for low-k dielectrics" by R. Havermann et al. in the 1998 proceedings of the Material Research Society vol 511, hereby incorporated by reference in its entirety.

As the conductors, characterized by a given resistivity p, are embedded in dielectric materials, characterized by a given dielectric constant k, the electromagnetic signals guided by these conductors will suffer from the distributed capacitive load introduced by these surrounding dielectrics. This capacitive load together with the resistance of the conductor adds a RC delay to the signal propagation and increases the response time of the interconnect scheme.

More problematic, signals transmitted through neighboring conductors, lying in the same or in adjacent interconnect planes, will be electromagnetically coupled. Hence electromagnetic interference, such as cross-talk and ringing, between adjacent signal lines occurs. Examples of signals that are particularly sensitive to these electromagnetic interference problems are the clock signals, governing the synchronization of the various functional blocks of a circuit. Furthermore, these clock signals require a signal distribution scheme from the clock input down to the individual components at lower levels on the wafer. Consequently the signal path the clock signals have to follow is quite long, thus more subject to the effects of propagation delay and electromagnetic interference.

In "Embedded ground planes using sidewall insulators for high frequency interconnections in integrated circuits" by D. Gardner et al. presented at the IEDM conference of 1993, pp. 251–254, an interconnect structure is disclosed containing a ground plane. This ground plane is an intermediate metal plane located in between two superposed interconnect levels. The proposed interconnect scheme offers a ground plane as is the case for example in microstrip lines. This ground plane is also capable of electromagnetic shielding the interconnect levels above this ground plane from the interconnect levels below, if the ground plane is present substantially all over the chip. However no shielding of signal lines within the same interconnect level is obtained, although these signal lines are more prone to electromagnetic interference. The proposed interconnect scheme requires an additional metal level and doesn't offer the flexibility of only shielding selected signal lines.

Another approach is outlined in "VLSI multilevel microcoaxial interconnects for high speed devices" by M. Thomas et al. presented at the IEDM conference of 1990, pp. 55–58. The author proposes to form a coax-like structure by first forming an interconnect level and afterwards removing the dielectric material underneath the conductors and in between the openings. The chip surface is then uniformly covered with a stack of a conformal CVD dielectric and a conformal metal layer forming a contiguous metal shield encapsulating the freestanding metal structure. The proposed interconnect structure will shield the encapsulated conductor from the higher interconnect levels and from the signal lines at the same interconnect level. The corresponding process sequence is however quite complex relying e.g. on a selective etch-back of the dielectric, the mechanical stability of the freestanding conductor, tight conformal deposition of the dielectric and metal layer forming respectively the intermediate dielectric and the shield of this coax-like structure. The proposed interconnect scheme doesn't offer the flexibility of only shielding selected signal lines and can not be used to shield dense patterns or tighter spaced signal lines or interconnect patterns.

In the international application WO 0131706 to S. Bothra et al., a method of fabricating coaxial RF lines for CMOS circuits is disclosed. The interconnects are formed by substructive etch of metal and dielectric. The proposed sequence is very complex and consists of first forming the bottom part of the shield and the insulator, then forming the metal core and the top part of the shield and the insulator by etching a stack of metal and dielectric layers and finally forming the side-parts of the insulator and the shield. This process sequence allows the formation of an RF line and a CMOS line within the same metal layer but at the expense of adding a multitude of additional patterning steps, i.e. lithographic and etch steps. This additional processing requires correct alignment of subsequent patterned elements.

Line spacing between RF lines must be increased to allow the formation of the side parts of the shield and insulator.

SUMMARY OF THE INVENTION

An aim of the present invention is to provide a coaxial interconnect scheme implemented in a damascene process technology.

An aim of the present invention is to provide shielded or coaxial interconnects for integrated circuits, preferably CMOS integrated circuits, by using a process technology based on a single or dual damascene technology.

An aim of the present invention is to provide a coaxial interconnect whereby at least the bottom and the sideparts of the shield and the insulator are formed simultaneously and self-aligned to the core of the coaxial interconnect.

An aim of the present invention is to provide an interconnect scheme implemented in a damascene back-end-of-line technology to shield selected interconnect lines.

An aim of the present invention is to provide an interconnect scheme comprising a common ground plane implemented in a damascene back-end-of-line technology.

An aim of the present invention is to provide shielded interconnects for integrated circuits by using a process technology based on a single or dual damascene technology, whereby said shielding of an interconnect level or line is realized at the stage of forming the interconnect level or interconnect line.

An aim of the present invention is to combine RF devices or circuits with a CMOS circuitry on a single, preferably semiconductor, substrate by means of a damascene based shielded wiring.

In a first embodiment a shielded damascene interconnect line is presented comprising at least two independent formed conductors isolated one from another. One conductor acts as a core conductor of a coaxial interconnect, while a shield conductor that wraps the bottom and the two sides of the core conductor. Process steps are outlined to implement the additional processing in the standard damascene technology. The basic technology suitable for this type of interconnects is the known damascene technology. After patterning the vias a first metal layer is created. Subsequently an intermediate dielectric e.g. SiC is formed, e.g. deposited by CVD, ALCVD or other ways known to a person skilled in the art, followed by forming the core metal. In accordance with the Cu damascene technology, the barrier layer of this technology can be used as the shield conductor and the intermediate dielectric between the two conductors, the insulator, can be any low-k material or any other suitable dielectric material. The Cu deposited on the insulator layer becomes the core layer of the coaxial interconnect. This Cu is used to fill the trenches and/or vias depending on the interconnect scheme. The shield and the insulator need to be optimized for thickness and are both preferably very thin. Alternatively a third conductor, a so-called guard, is added by using processing steps and methods similar to these applied in other embodiments.

In a second embodiment of the present invention materials other than the standard damascene materials are used to form the shield and the intermediate dielectric.

BRIEF DESCRIPTION OF THE DRAWINGS

All drawings are intended to illustrate some aspects and embodiments of the present invention. Devices and fabrication steps are depicted in a simplified way for reason of clarity. Not all alternatives and options are shown and therefore the invention is not limited to the content of the given drawings. For the purpose of teaching the drawings are not made to scale.

FIGS. 7a–c show a cross-sectional view of a DD process sequence for obtaining a connection between shields belonging to two stacked shielded interconnect levels according to an embodiment of the invention.

FIGS. 8a–g show a cross-sectional view of a process sequence whereby selected shielded conductors are formed in a damascene metal level containing unshielded conductors according to an embodiment of the invention.

FIGS. 9a–b show a top-plan view and a cross-sectional view, respectively, of an inter-chip coaxial interconnection scheme using damascene process technology according to an embodiment of the invention.

Figure 1:
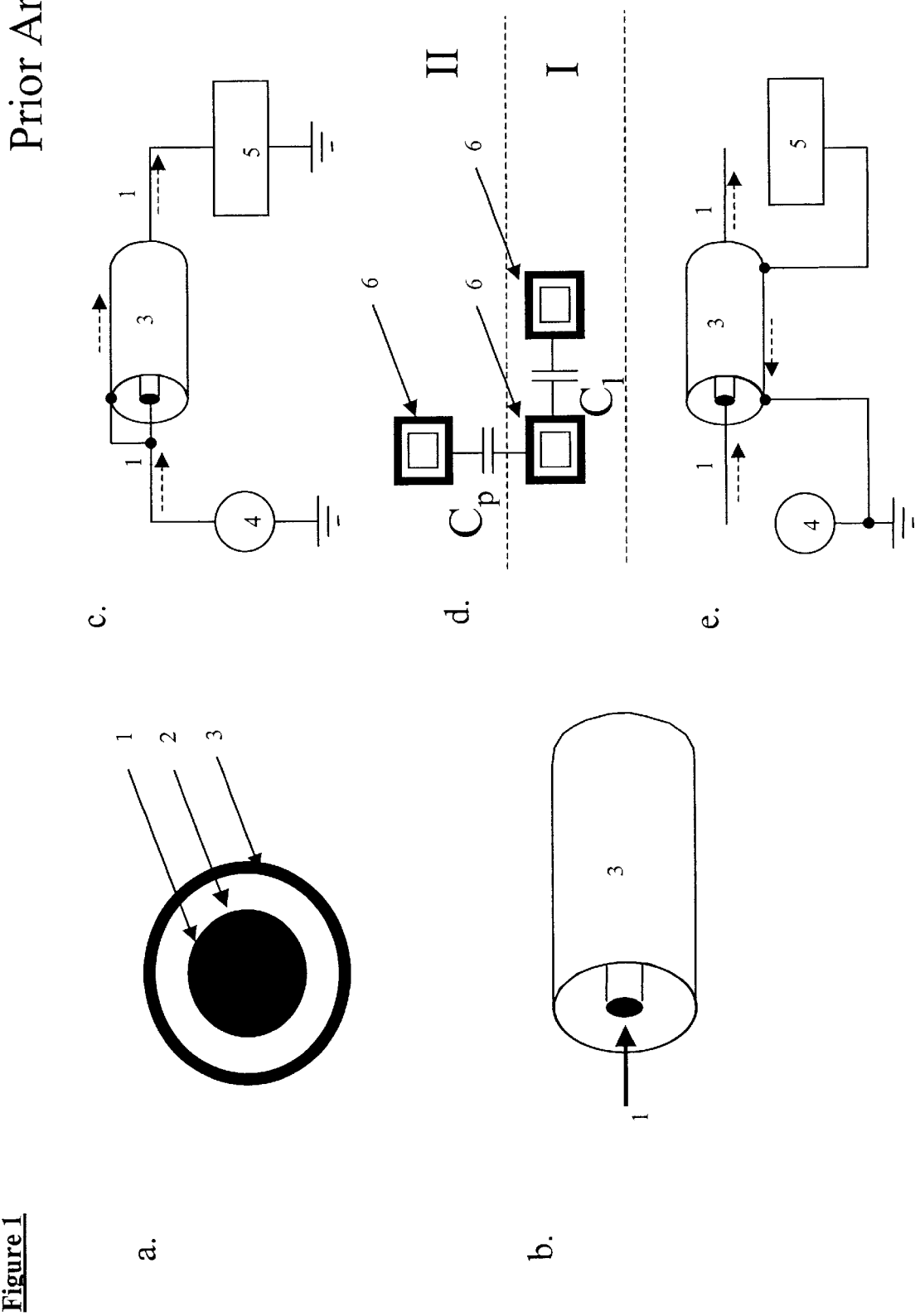
FIGS. 1a–e show diagrams of a prior art coaxial interconnection and electrical configuration.

Table 1 provides an overview of the process steps according to a preferred embodiment Table 2 provides an overview of the barrier diffusion properties of the composing layers of the shielded interconnect according to an embodiment.

Table 3 provides a list of numerals used in the drawings.

DETAILED DESCRIPTION OF THE INVENTION

The following description of the invention is described in detail in relation to the drawings. It will be apparent from the following description, however, that a person skilled in the art can imagine several other equivalent embodiments or other ways of executing the present invention, the spirit and scope of the present invention being limited only by the terms of the appended claims.

In a first aspect of the invention a method is disclosed for manufacturing shielded interconnects used in integrated circuits. The disclosed interconnect scheme comprising such shielded interconnect lines utilizes a technology based on a damascene back-end-of-line (BEOL) process architecture.

Before describing features of the invention, an overview of the principle of coaxial wiring is first provided. In electronics, a known solution to reduce the RC delay along a signal line and to limit the electromagnetic interference between adjacent signal lines is to introduce coaxial wiring. A coaxial interconnection or coax-line (6) is composed of two concentric conductors as illustrated in FIGS. 1a and 1b. The outer conductor (3), also labeled as shield, encircles this inner conductor (1), also labeled as core. Both conductors are electrically isolated by an intermediate dielectric (2), also labeled as insulator. Additional conductors can be added, surrounding the inner and outer conductor and centered along the same axis. If a third coaxial conductor (19), known as guard, is added, the corresponding structure of three co-axial conductors, mutually isolated by intermediate dielectrics, is labeled as triax.

The two conductors of a coaxial line can be electrically configured in different ways. The shield (3) can be connected to the core (1) at the signal source side (4) as shown in FIGS. 1c. This connection scheme ensures that both conductors are submitted to the same signal generated by the signal source (4) and eliminates the parasitic capacitance affecting the electromagnetic signal travelling along the core. The advantage is twofold:

a) reduction of the propagation delay of the signal along the interconnect line by reducing the capacitive contribution in the time constant RC, where R and C are respectively the resistance of the core and the distributed parasitic capacitance seen by the core itself;

b) reduction of the electromagnetic interference of the signal along the core with adjacent signal lines, by reducing the capacitance C, where C is the coupling capacitance between adjacent lines. This capacitance can be the inter-line ($C_l$) or the inter-plane ($C_p$) capacitance as illustrated in FIG. 1d showing an interconnect level (II) with one coaxial conductor (6) on top of a lower interconnect level (I) having two coaxial conductors (6). The shield (3) could be also used as the return path of the signal sent through the core (1), if the resistance of the shield is comparable with the resistance of the core. This connection scheme is illustrated in FIGS. 1d where the shield is contacted at both the source (4) and the load (5) side. The advantage of this configuration is that it cancels the magnetic fields generated by signal through the two conductors, due to the opposite flow of current in each conductor as illustrated by the dashed arrows.

Finally the shields of all signal lines within the same metal layer or interconnect level can be connected together to provide a common ground plane. Such common ground plane is desirable in high frequency applications as it allows to control the characteristic impedance of the interconnect line and to reduce cross-talk and the reflection of signals.

Figure 2:
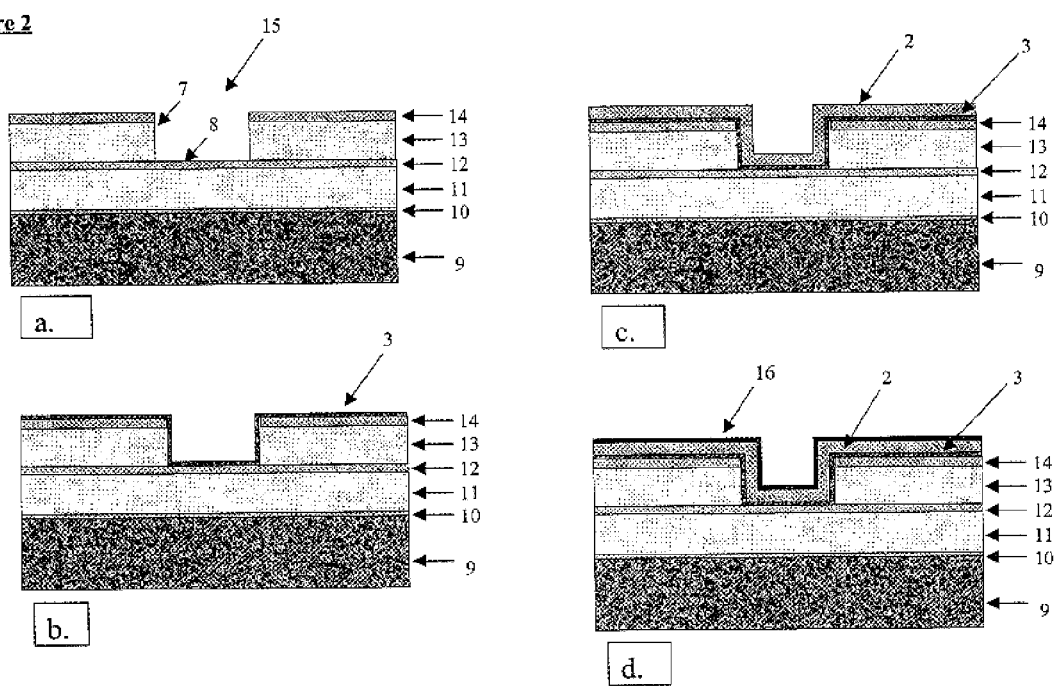
FIGS. 2a–g show an illustrative diagram of the process of making coaxial interconnects in a single damascene process flow according to one embodiment of the invention.

In a first and preferred embodiment, illustrated in FIGS. 2a–g, the shielded interconnect is processed using a single damascene technology to implement the coaxial interconnect scheme. The interconnect line comprises two independently formed conductors (1,3) isolated from each other by a dielectric (2): a core conductor (1) and a shield conductor (3) covering the sidewalls (7) and/or the bottom (8) of the via comprising the core conductor as is illustrated in FIG. 2g. The core conductor is at least partially surrounded and enveloped by the shield conductor. Preferably the bottom part and the sidewalls of the core conductor are wrapped by the insulator (2) and the shield (3). The proposed process sequence follows the standard flow for a single damascene metallization up to the patterning of the via. After this step the definition of the shield-core assembly is done, according to the following steps.

Single Damascene Trench Formation (FIG. 2a)

The starting point is after the completion of the trench patterning for a damascene metallization as shown in FIG. 2a. On a semiconductor substrate (9) comprising active devices (not shown) such as transistors or passive devices such as capacitors or resistors (not shown) or other devices formed in the front-end-of-line processing, interconnect levels are formed. In a dielectric stack comprising a bottom hard mask or etch stop layer (10), a first dielectric layer (11), an intermediate hard mask (12), a second dielectric layer (13) and a top hard mask (14) a trench (15) is formed. Typically SiC, SiON or nitride are used as hard mask (10,12,14) material, while the dielectric layers (11,13) are composed of oxides or low-k materials: spin-on-materials such as FOx (Dow Corning) or chemical-vapor-deposited (CVD) materials such as Aurora (ASM Japan). Typical thickness of the hard mask ranges from 50 nm to 150 nm, according to the level of optimization of the etch step; the thickness of the dielectric layers ranges from 500 nm to 1 um, according to the thickness to be given to the conductors. These ranges can be exceeded if needed and if feasible with the desired resistance of the core and the shield and with the desired capacitance between core and shield. The materials and thickness ranges listed above are for illustration purposes only as other materials are known in the art to form a damascene metallization scheme The use of these materials should not be construed to limit to scope of the present invention.

Shield Deposition (FIG. 2b)

As shown in FIG. 2b, on top of this standard single damascene (SD) substrate the outer or shield conductor (3) is formed. The shield conductor can be a single conductive layer or a stack of conductive layers. The conductive layer can be a metal or a metal alloy. The shield conductor can be formed by sputtering, by plasma vapor deposition (PVD), by CVD such as plasma-enhanced CVD (PECVD) or selective/non-selective atomic-layer CVD (ALCVD), or other techniques know to a person skilled in the art to form a conductive layer. The shield deposition is preferably done in a manner analogous to formation of the barrier layer (16) in a conventional copper damascene architecture. The shield material to be deposited can be a barrier metal as well, e.g. a Ti—TiN bilayer or TaN. The minimal thickness of the shield layer is chosen according to the required sheet resistance, which can depend on the connection scheme as illustrated in FIGS. 1c and 1e. The maximum thickness that can be given to the shield layer is limited by the space allocated in the trench (14) to the other elements to be added, i.e. the insulator (2) and the core (1). A typical range of thickness for the shield goes from 50 nm to 500 nm, preferably from 10 to 300 nm. A good conformity, meaning that the shield layer (3) has substantial the same thickness on both the sidewalls (7) and the bottom (8) of the trench (15) is desirable, but not mandatory. It is desirable that full coverage of the walls, i.e. side walls (7) and bottom (8) of the trench (15) be obtained in order to get the maximum shielding effect. If only the bottom (8) or only the sidewalls (7) are covered with the shield layer only a substantial shielding of the core (1) towards respectively the lower interconnect levels or the in-plane signal lines is obtained.

Insulator Deposition (FIG. 2c)

After the formation of the shield layer (3) the insulator (2) of the coaxial interconnect (6) is formed. The insulator material should have good insulating properties, such as low leakage current, high breakdown voltage, and a low dielectric constant in order to keep the capacitance between shield and core as small as possible. Materials eligible for this purpose are the materials commonly used for SD and DD applications as low-k materials. Examples of such materials are layers comprising silicon, oxide, nitride and/or carbide such as SiC, $Si_xO_yC_z$ with x+y+z=1, $Si_3N_4$. The minimal thickness of the insulator is determined by the maximum capacitance, while an upper limit is imposed by the space left in the trench (15) to the core stack (1). A good conformity is desirable, considering that the insulator thickness defines the dimensions of the already partially filled via (15) in which the core has to be formed. A typical range of thickness for the insulator goes from 10 nm to 500 nm, preferably from 50 to 300 nm.

Core Deposition (FIGS. 2d–e)

After the formation of the shield (3) and the insulator (2) the core (1) of the coaxial interconnect line is formed. This process step is similar to the metallization of a trench in a conventional copper damascene architecture. A barrier layer (16) (see FIG. 2d) is recommended to prevent diffusion of the core material, e.g. copper, in the insulator (2) and to improve the adhesion of the core material to the insulator. This adhesion is a key factor for performing a successful consequent CMP step. It is desirable that the barrier layer 16 be as thin as possible, otherwise too much space to the copper core material in the trench defined by the insulator. A good barrier conformity and integrity are desirable. After the formation of the barrier (16) the core layer (17) is formed. In a standard damascene architecture a Ti/Tin stack or Ta(N) is used as barrier layer, while copper is used as core material. The copper can be formed by optionally forming a seed layer (not shown) and afterwards plating a copper layer until the desired copper thickness is reached. In European patent application EP 1 022 355 assigned to the assignee of the present application, hereby incorporated by reference in its entirety, a method for electrolessly plating a copper layer is disclosed. In the U.S. application Ser. No. 60/257,649 assigned to the assignee of the present application, hereby incorporated by reference in its entirety, a method for electroplating a copper layer is disclosed.

Planarizing the Substrate (FIGS. 2f–g)

In a standard damascene technology the metal stack shown in FIG. 2e is polished and planarized by chemical-mechanical polishing (CMP) techniques until the underlying dielectric layer (13) is exposed. Substantially all the metal outside the trench area is removed leaving only the trenches filled with the metal stack. Optionally an additional hard mask (14) is present on top of this dielectric layer (13) and this top hard mask (14) can serve as a polish stop layer. In the present invention layers (2,3) additional to the standard damascene stack, are present, allowing for alternative CMP sequences. One can choose to stop the polishing process at the shield layer (3) as shown in FIG. 2f, thereby using it as an CMP stop layer. In this process option the shield layer remains essentially unaffected by the polishing process and the shield pattern resulting from the processing illustrated in FIG. 2d is kept. One can have the shields of all the shielded trenches in the present interconnect level connected together and biased to a common potential. One may stop the polishing process after the shield has been removed and the underlying dielectric layer (13) or optional top hard mask (14) is exposed as is the case in the standard damascene process. As shown in FIG. 2g the shield (3) and the insulator (2) are only present within the trench (15). Essentially all the shield material in between the vias (15) defined in the IMD stack is removed. Consequently the shield is confined to the trench area of each signal line and the shields of all the shielded trenches are electrically independent from each other. Endpoint detection of the polishing process by monitoring the change in reflectivity of the current exposed surface is possible in both options. The first option is more sensitive to process variations as the thickness and hence the resistance of the shield layer (3) outside the trench area (15) depends on the stopping efficiency of the polishing process.

The steps of forming the shield layer (FIG. 2b) and the insulator layer (FIG. 2c), at least within the trench bottom (8) or sidewalls (7), are additional to the standard single damascene process sequence. By introducing these deposition steps prior to the standard metallization sequence a coaxial interconnect line is formed capable of shielding adjacent signal lines within the same interconnect level or towards signal lines at lower interconnect levels. The proposed process sequence requires only two additional deposition processes, while the standard damascene process sequence needs not to be changed. The present invention allows the simultaneous formation of the coaxial elements (2,3) of the interconnect with the core element, i.e. the metallization of a conventional damascene technology.

Experimental Results

Figure 3:
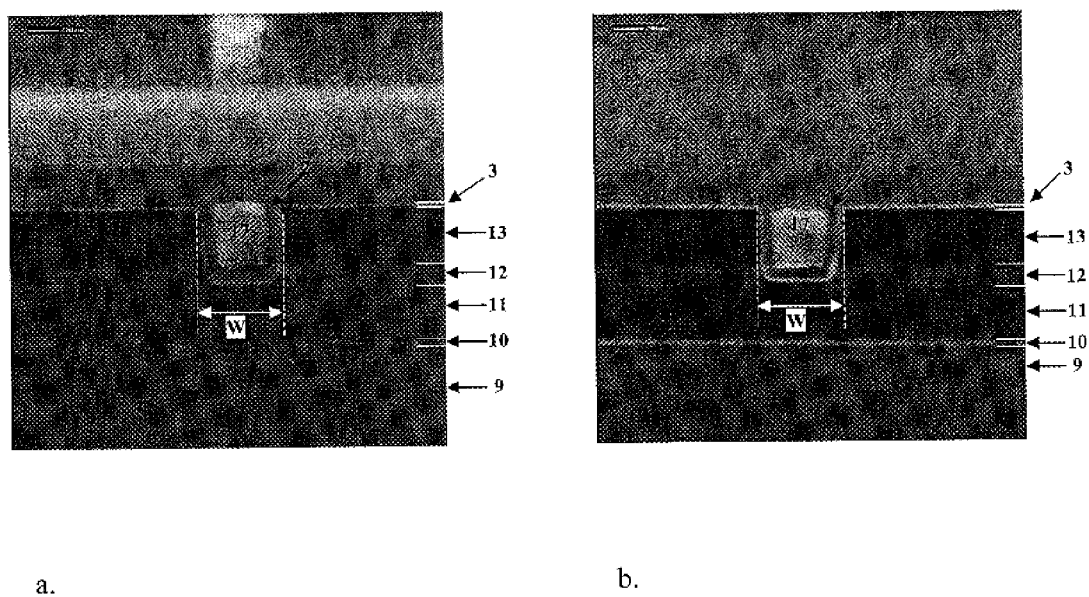
FIGS. 3a–d show cross-sectional SEM pictures illustrating the preferred embodiment of FIG. 2f for various dimensions and conditions.

A single damascene approach as illustrated in FIGS. 2a–f has been tested. The process steps are reported in table 1, together with the different splits for testing different shield and insulator thickness for a variety of insulated and dense metal lines of different width and spacing. For the purpose of performing the experiment the endpoint detection of the CMP step was not used but instead a timed polishing step leaving the shield layer intact was used. Dense and isolated trenches were filled with a coaxial stack comprising a first conductor acting as shield (3), a dielectric acting as insulator (2) and a second conductor acting as core (1). FIGS. 3a–b show an insulated trench of 0.5 um width filled with 50 nm PVD-deposited Ta as shield layer. The insulator is made of SiC having a thickness of 150 nm (FIG. 3a) or 100 nm (FIG. 3b). Finally the standard trench metallization comprising 10 nm TaN barrier layer, 150 nm Cu seed layer and 1000 nm plated Cu layer is formed. The planarization of the metal stack is done down to the shield layer (3) as schematically shown in FIG. 2f. FIG. 3c shows a dense interconnect pattern comprising 4 lines having a width W=400 nm and a spacing S=400 nm. The pattern is planarized and filled with a shield layer of Ta ($t_s$=50 nm) and an insulation layer of SiC ($t_i$=150 nm). FIG. 3d shows a large trench (W=2.0 um) planarized and filled with a shield layer of Ta ($t_s$=50 nm) and an insulation layer of SiC ($t_i$=150 nm). As explained in the background section e.g. clock lines conveying large amounts of power are very sensitive to electromagnetic interference due to their length as they distribute the clock signal all over the chip. The cross section of clock lines at higher interconnect levels is large in order to keep the current density within these conductors below the physical limitations of the metal. For such large lines the offset $t_s+t_i$ to the trench width W, introduced by depositing the shield and insulator layer within the trench, is negligible and will essentially not affect the conducting properties of the core layer. Hence the shield and insulator can be made thicker leading to a more improved shielding of the core signal.

Figure 4:
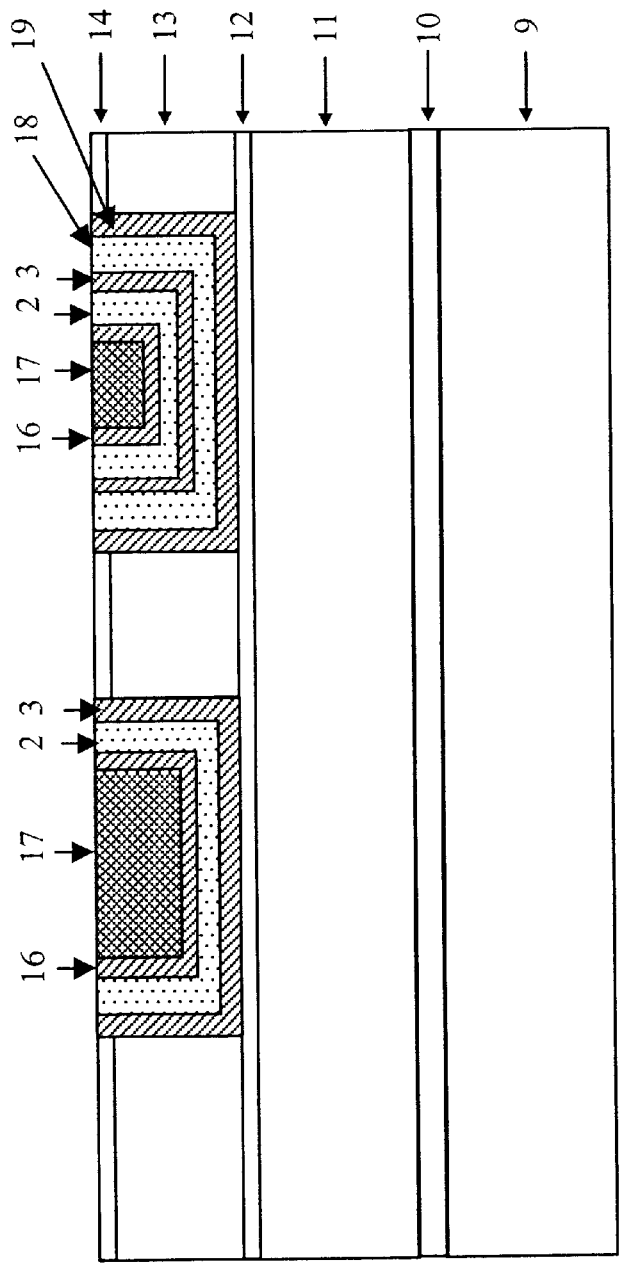
FIG. 4 shows a cross-sectional view of the implementation of coaxial and tri-axial shielded interconnect using copper damascene process according to one embodiment of the invention

In a second embodiment of the first aspect, illustrated in FIG. 4, the shielded interconnect is processed using a single damascene technology to implement a triaxial interconnect scheme. FIG. 4 shows on the left side a coaxial interconnect according to the preferred embodiment and on the right side a triaxial interconnect. Depending on the actual dimension W of the trench an additional second shield (19) and second insulator (18) can be formed at least within the trench prior to the step of forming the shield (3) and the insulator (2) of the coaxial interconnect. This second shield layer, third conductive layer (19) or guard layer and the second insulator (18) can be formed in a manner analogue to the formation of the first shield (3) and insulator (2) layer. This stack of layers allows a mixed configuration of the interconnect schemes discussed above and illustrated in FIGS. 2c and 2e.

In the following embodiments of the first aspect process sequences are disclosed implementing the coaxial or semi-coaxial interconnect scheme in a single or dual damascene process and various connection schemes are illustrated. The flexibility of the present invention allows for various process options in order to meet the requirements of the different applications or embodiments.

Figure 5:
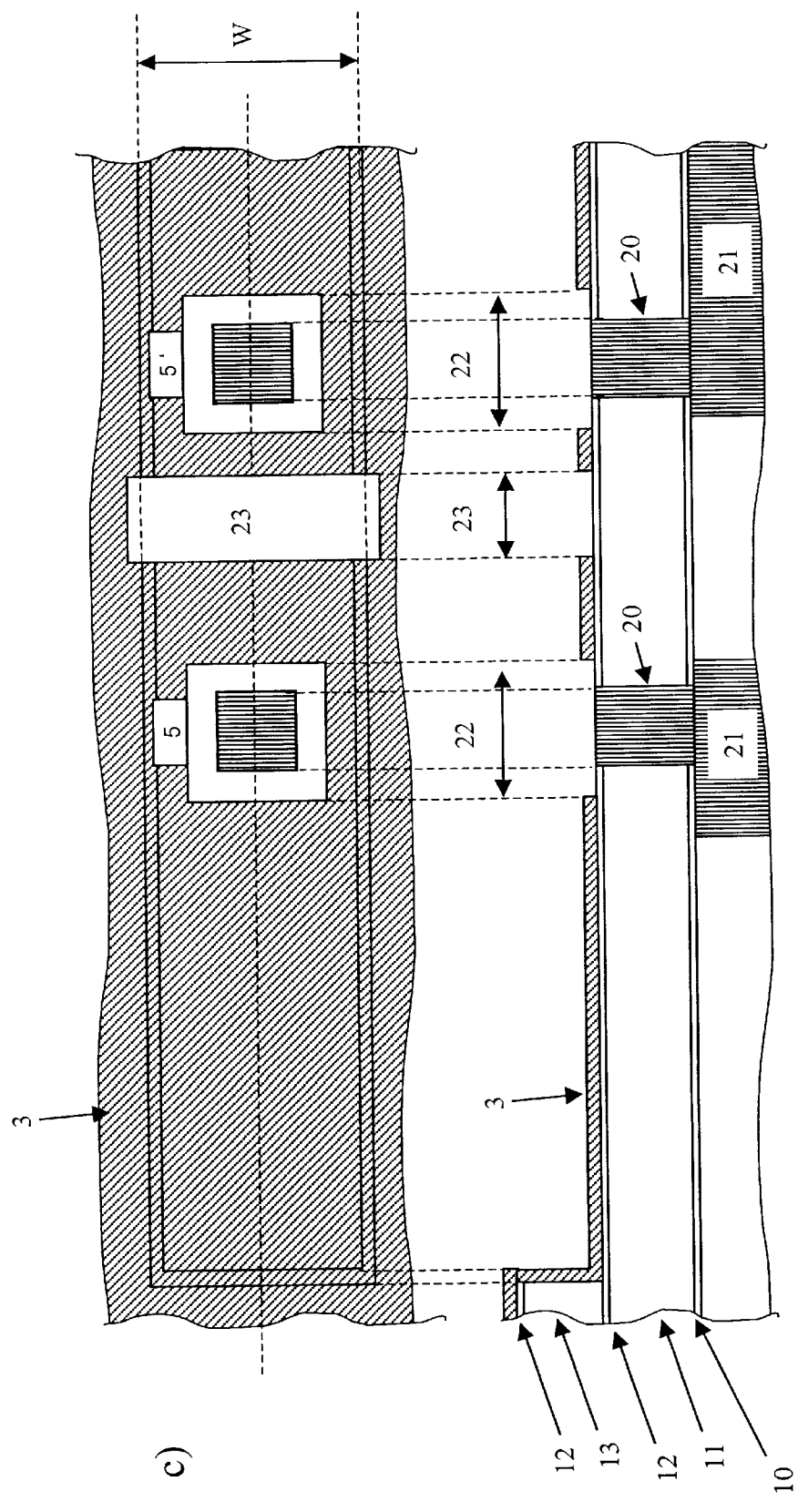
FIGS. 5a–e show a cross-sectional view of single damascene (SD) and FIGS. 5f-l show a dual damascene (DD) process sequences for a single input/multiple output configuration of the shielded interconnect and interruption of the shield and connection of the shield to the core according to an embodiment of the invention.
Figure 5:
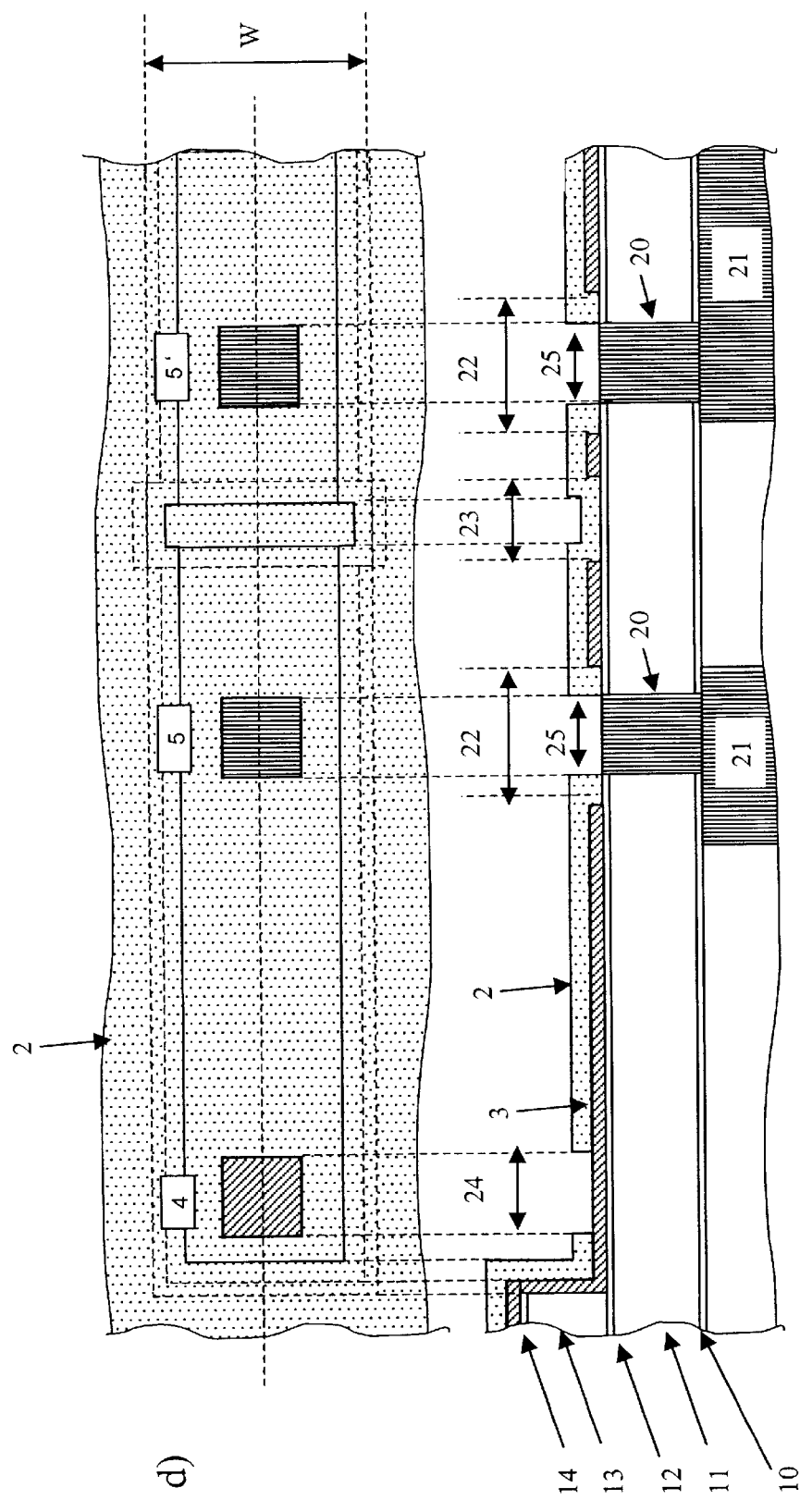
Figure 5:
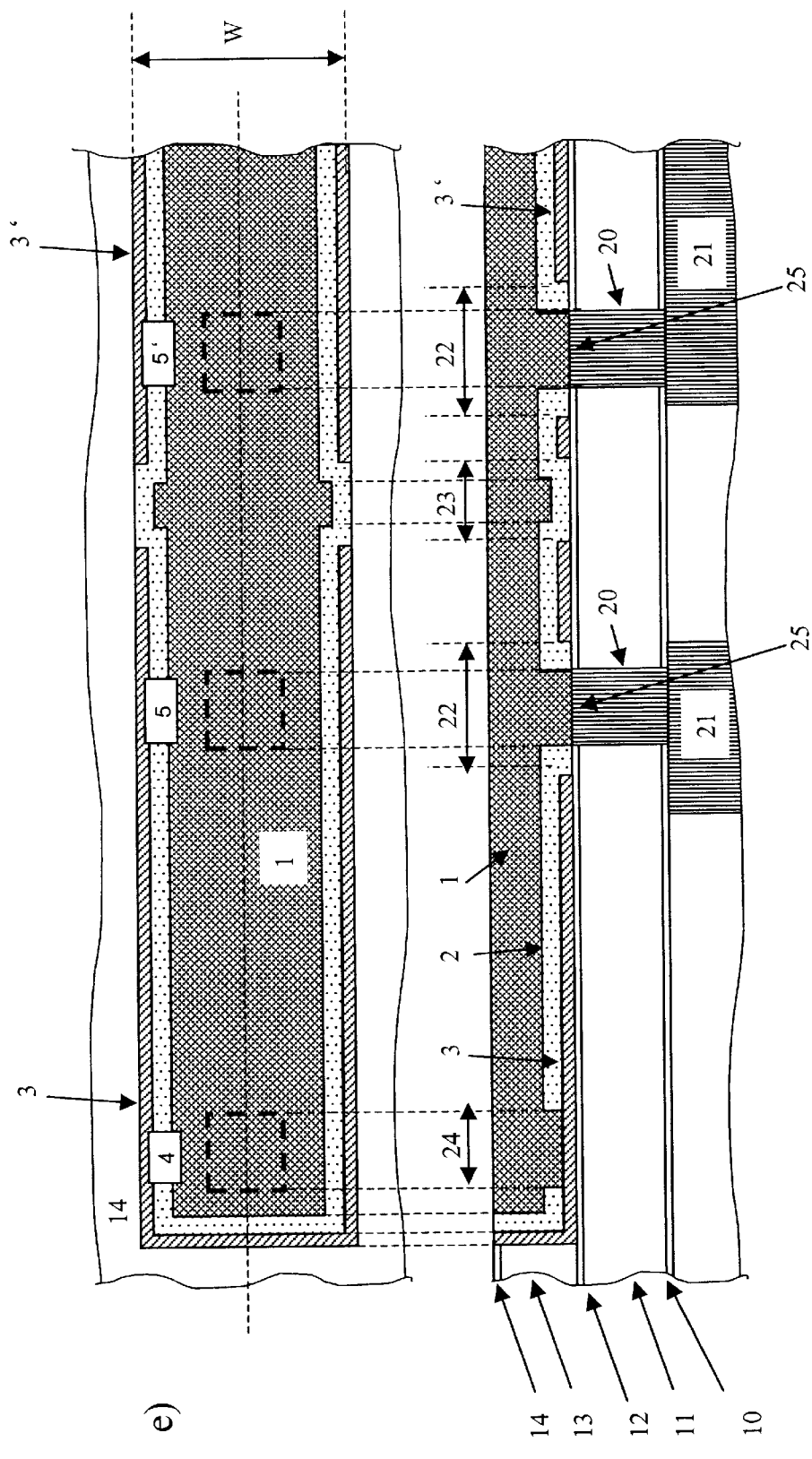
Figure 5:
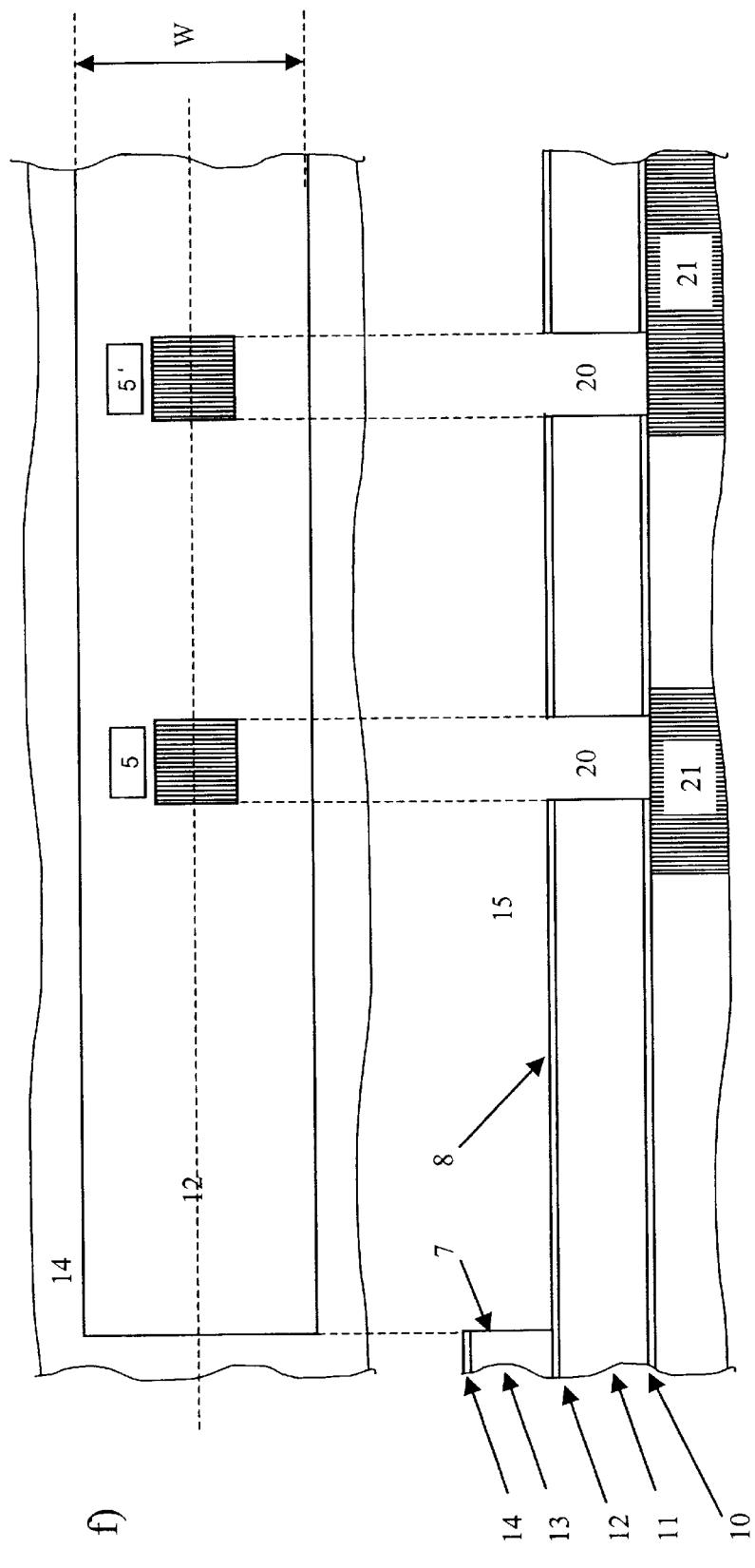
Figure 5:
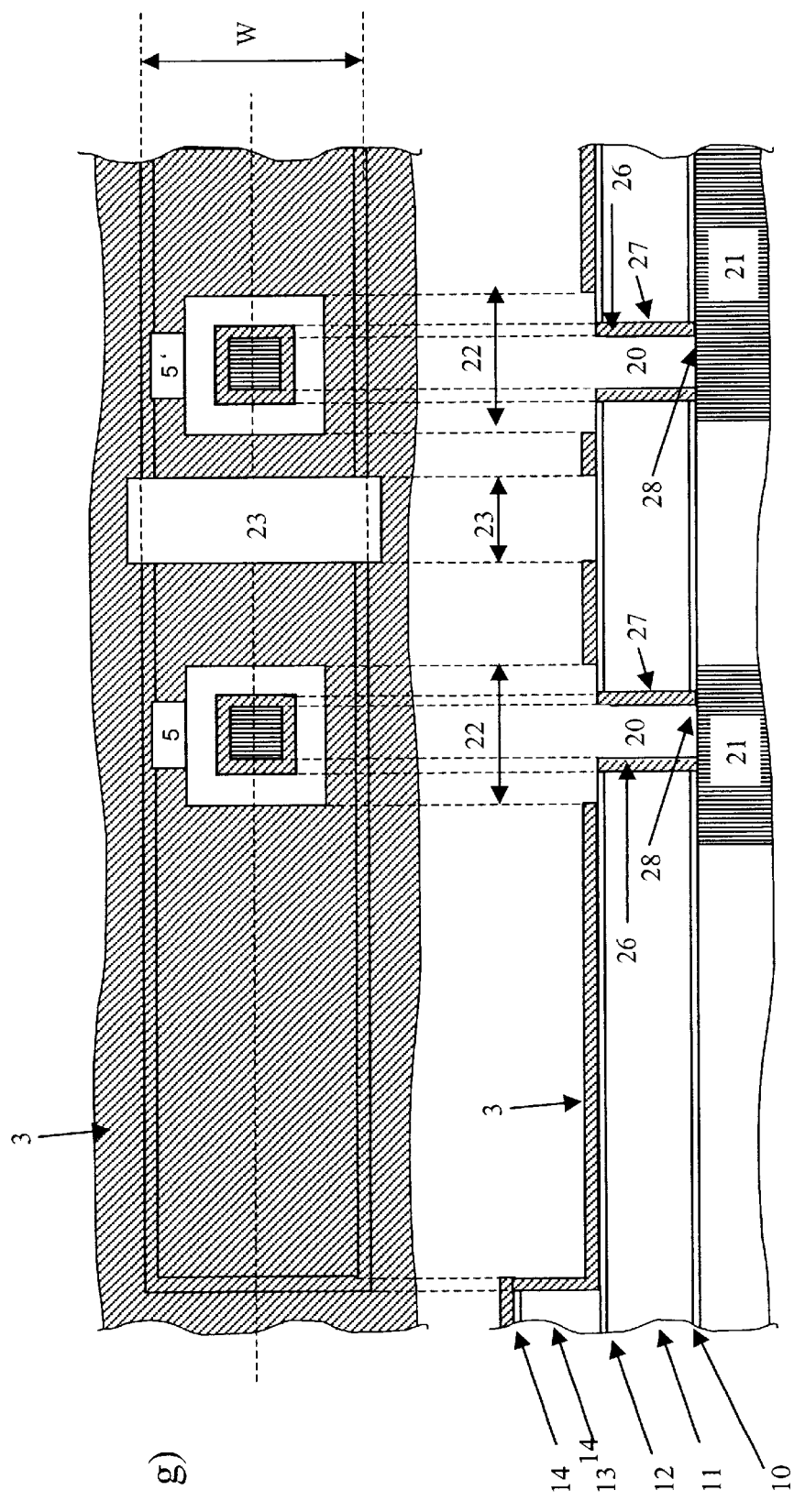
Figure 5:
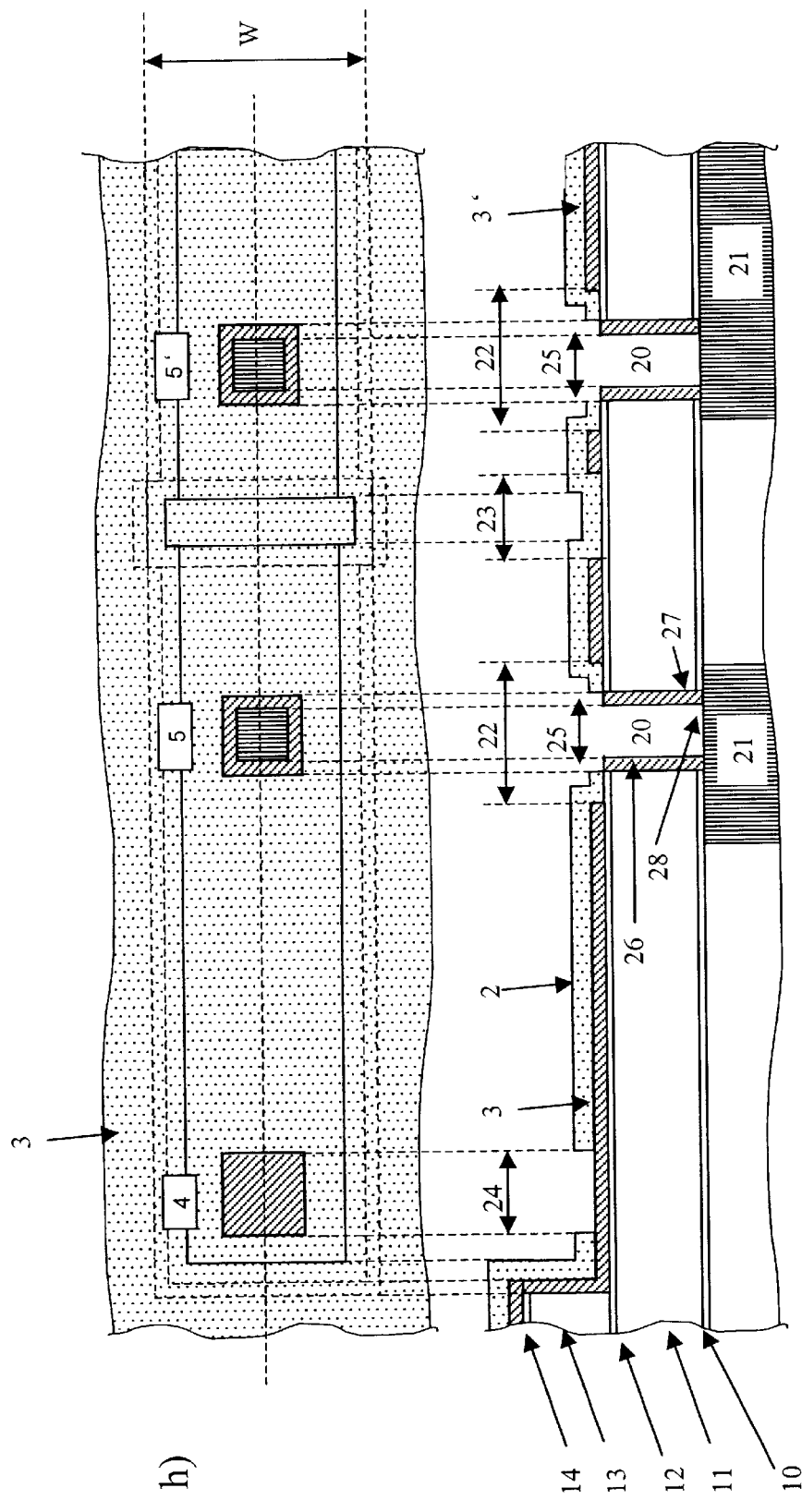
Figure 5:
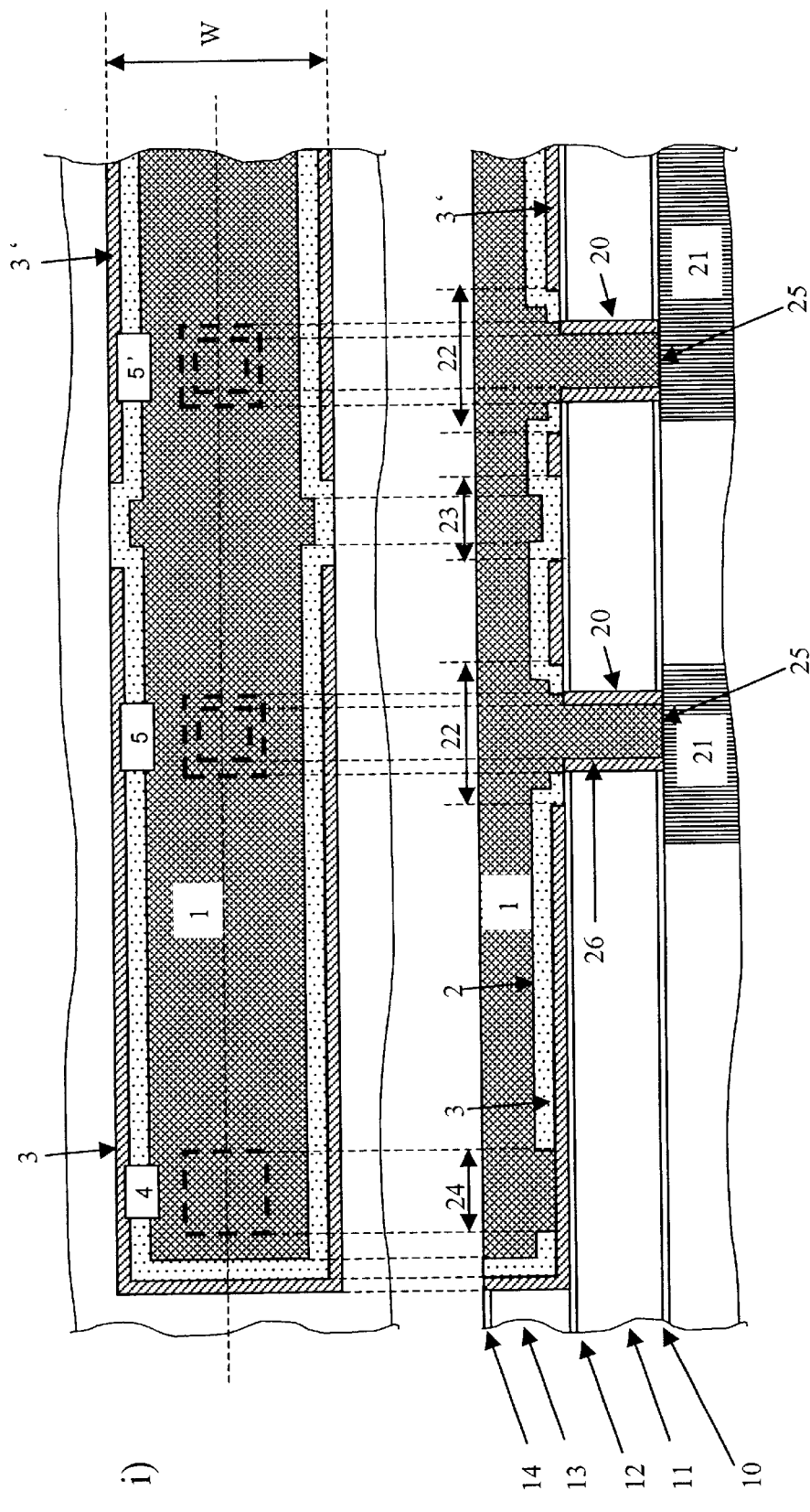
Figure 6:
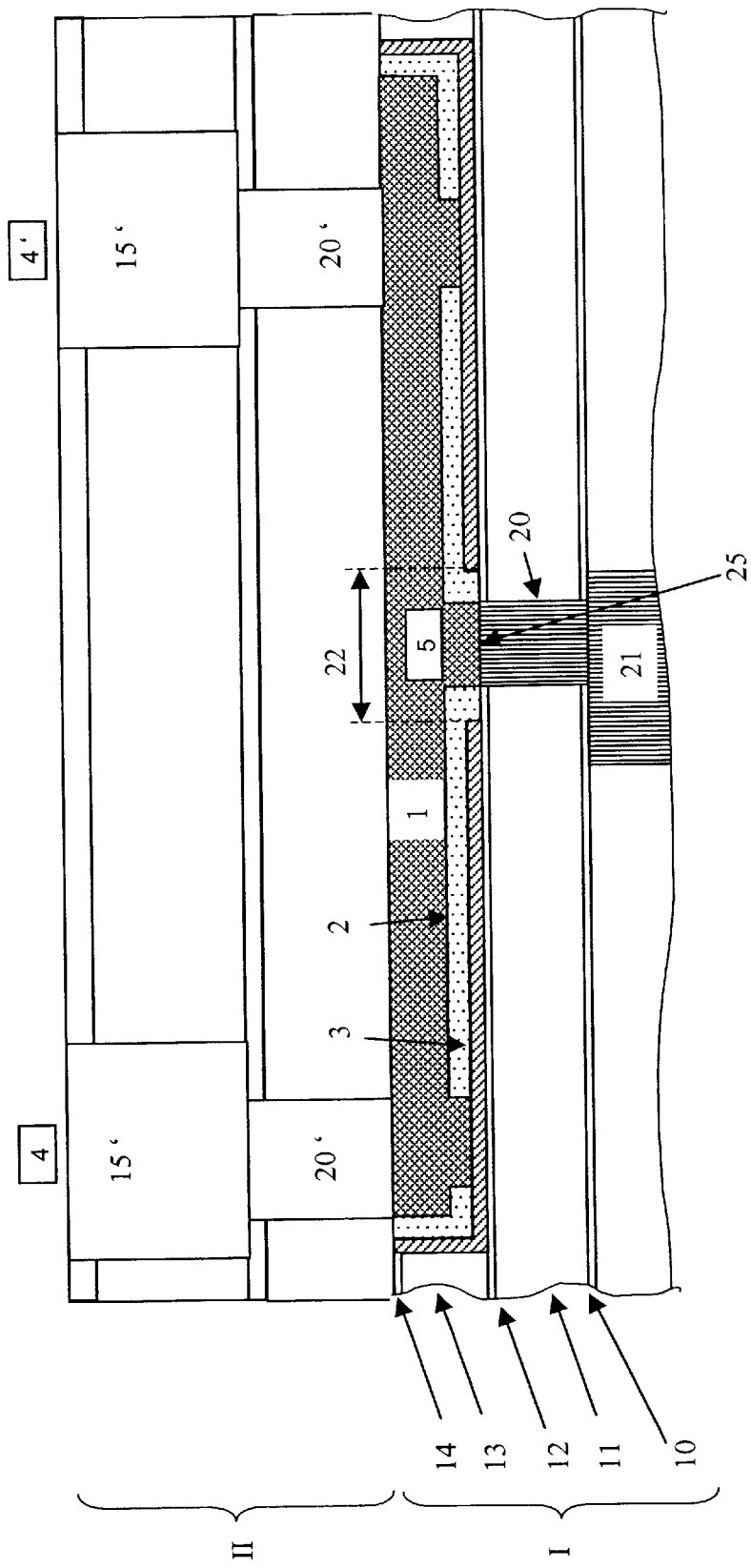
FIGS. 6a–c show a cross-sectional view of single damascene (SD) and FIG. 6d shows a double damascene (DD) for a multiple input/single output configuration of the shielded interconnect according to an embodiment of the invention.

The practical use of the shielded damascene interconnect depends inter alia on a) the possibility to bring the shielded signal carried by the core in one interconnect level to lower metal or interconnect levels, b) the possibility to interrupt the shield (3) along the coaxial line and c) the possibility to connect the core (1) with the shield (3) at a certain point. These process options can provide a further flexibility for new possible applications of a damascene based shielded interconnect scheme. Moreover, a need could exist d) to electrically connect shields belonging to coaxial interconnects formed at different metal levels. The process options identified above require some extra process steps with respect to a conventional damascene metallization scheme. Both the SD and the DD approach for options a,b,c are illustrated in FIGS. 5 and 6. The DD approach for option d is illustrated in FIG. 7.

A fourth embodiment illustrated by the electrical equivalent scheme of FIG. 5a, discloses the option of having a connection between the core (1) and shield (2) of a coaxial line only at the signal source side (4) can be obtained both in single (SD) (FIG. 5b) and in dual (DD) damascene architecture (FIG. 5c). In this example one input (4) from a higher level interconnect layer is connected with at least one output (5) to a lower metal level. The shield can also be interrupted if needed, as shown on by FIG. 5a. The shield (3) is connected to the signal source side (4), while the shield (3') is not connected to the shield (3) or the signal (4).

The preferred process sequence for implementation in SD an interconnect scheme with core (1) connected to the shield (3) and having an interrupted shield along the core is the following.

SD Trench Formation (FIG. 5b)

The starting point is after the completion of the trench (15) patterning of the dielectric stack on top of the lower metallization level (21). The description of the dielectric stack has been already reported in the text referring to FIG. 2a. The first dielectric layer (11) already comprises the filled via openings (20) for the passage of the shielded signal to lower interconnect levels (21)

Shield Deposition and Patterning (FIG. 5c)

The description of the shield deposition has been already reported in the text referring to FIG. 2b. In order to connect the core (1) to the lower metal (21), a patterning sequence comprising a lithographic processing and -etching step is performed to remove the uniformly deposited shield (3) from an area (22) wider than the via (20) opening. This area (22) is aligned to and overlapping the via area (20). If it is necessary to interrupt the shield along the signal line, i.e. at a certain point of the trench, the same or more litho-etch steps are performed to remove the shield from an area (23) wide enough to cross the entire trench width and large enough to ensure a complete removal of the shield from the bottom and the sidewall of the trench in this area (23). In the case of an interrupted shielded interconnect it is important to remove substantially all shield material in this area (23), both in the bottom region (8) and in the sidewall region (7) within this part (23) of the trench to completely interrupt the electrical continuity in the shield. As shown in FIG. 5c the shield material is removed at the bottom of the trench, on the sidewalls and even on the surface adjacent to the trench.

Insulator Deposition and Patterning (FIGS. 5d)

The description of the insulator deposition (3) has been already reported in the text referring to FIG. 2c. In order to connect the core (1) to the lower metal (21), a patterning sequence is performed to remove the uniformly deposited insulator on top of the via (20), in an area (25) of comparable size of the via (20) opening, in order to expose the conductor material filling the via. This opening (25) formed in the insulator (3) is aligned to and essentially coincides with the via opening (20). Some misalignment in the patterning of this opening (25) is tolerable as long as a substantial part of the via opening (20) remains exposed (20). This opening (25) is smaller than the opening (22) formed in the shield layer (3). If it is necessary to connect the shield (3) with the core (1) at a certain point of the trench, the same patterning sequence removing the insulator material above the via opening (20) is performed to remove the insulator (2) from an area (24) at the bottom of the trench where the connection is desired. The insulator (2) will also fill the opening (23) created in the shield and electrically isolate both parts (3, 3') of the shield conductor along the core line.

Core Deposition. Planarizing and Polishing (FIG. 5e)

The description of the core (17) deposition, planarizing and polishing has been already reported in the text referring to FIGS. 2d–e and 2f–g. The core conductor (17) with its barrier (16) (not shown in the figure) fills the trench. The insulator (2) electrically insulates the core (3) from the shield (2) except in those areas (24) where the insulator (2) has been removed. In the area (24) the core conductor is electrically contacted with the shield (3). In the area (25) the core material contacts the exposed plugs in the via opening (20) without coming in contact with the shield. The option to planarize and remove the core materials by polishing down to the shield (3) or down to the underlying layer, e.g. top hard mask (14) is still valid, depending on the need to have a common shield for all the trenches or having each trench with its own shield independent electrically from the others shields formed in trenches within the same interconnect level.

The preferred process sequence for implementation in DD an interconnect scheme with core (1) connected to the shield (3) and having an interrupted shield along the core is the following.

DD Trench Formation (FIG. 5f)

The starting point is after the completion of the trench and via patterning of the dielectric stack on top of the lower metallization level (21). The description of forming the dielectric stack has been already reported in the text referring to FIG. 2a. FIG. 5f shows the trench (15) opening formed in the second dielectric layer (13) and the via opening (20) formed in the first dielectric layer (11). Contrary to the SD approach these vias (20) are not yet filled with a metal. At the bottom of the vias the lower metal level (21) is exposed for the electrical connection of the shielded conductor.

Shield Deposition and Patterning (FIG. 5g)

The description of the shield deposition (3) has been already reported in the text referring to FIG. 2b. In order to connect the core (1) to the lower metal (21), a patterning sequence is performed to remove the shield material from an area (22) wider than the via (20) opening. This opening (22) is aligned to and overlaps the via opening (20). In the DD approach, a residual shield (26) on the sidewall (27) and on the bottom (28) of the vias (20) could remain depending on the selectivity and the anisotropy of the process removing the shield material. This residual shield material (26) does not represents a problem because this remaining shield is disconnected from the shield present in the trench, due to the overlap of the opening (22) over the via opening (20). As for the SD process step sequence, if it is necessary to interrupt the shield at a certain point inside the trench, the same or additional patterning sequences are performed to remove the shield from an area (23) wide enough to cross the entire trench width W and large enough to ensure a complete removal of the shield from the bottom and the sidewall of the trench in this area (23). In this case is important not to leave any residual shield material in this area (23), both in the bottom and at the sidewalls of the trench in order to completely interrupt the electrical continuity in the shield. As shown in FIG. 5g the shield material is also removed on the surface of the top hard mask (14) adjacent to the trench, the area (23) overlaps with the trench opening in a direction substantially perpendicular to the orientation of the trench.

Insulator Deposition and Patterning (FIG. 5h)

The description of the insulator deposition has been already reported in the text referring to FIG. 2c. In the DD approach, the insulator is also uniformly deposited on the bottom and on the sidewalls of the via and of the trench. In order to connect the core (1) to the lower metal (21), a patterning sequence is performed to remove the insulator within an area (25) overlapping the via (20) opening. During this patterning sequence the insulator (2) is removed at least from the bottom (28) of the via (20) thereby exposing the underlying lower metal conductor (21). There could be a residual insulator spacer formed on the sidewall of the vias depending on the insulator removal process. These dielectric spacers inside the via formed adjacent to the residual shield material (26) do not represent a problem if the area left in the via for receiving the core material (e.g. 16,17) is wide enough to provide the desired electrical connection width to the lower metal level (21). If it is necessary to connect the shield (3) with the core (1) at a certain point in the trench, the same litho-etch sequence for removing the insulator material at least at the bottom of the via, is performed to remove the insulator from an area (24) in the bottom of the trench where this connection is desired. The insulator (2) fills the opening (23) defined in the shield layer and electrically insulates both parts (3, 3') of the interrupted shield.

Core Deposition, Planarization and Polishing (FIG. 5i)

The description of the core deposition, planarization and polishing has been already reported in the text referring to FIGS. 2d–e and 2f–g. The core conductor (17) with its barrier (16, not shown in figure) fills the trench and the vias. The insulator (2) electrically insulates the core (3) from the shield (2) except in those areas (24) where the insulator (2) is removed. In the area (24) the core conductor (1) is directly and electrically contacted with the shield (3). In the area (25) the core material directly and electrically contacts the exposed lower metal level (21) without coming in contact with the shield (1). As mentioned above some residual shield material (26), optionally covered with insulator spacers, can be present within the via opening (20). These residues (26) however are isolated from the shield conductor (3) and don't short-circuit the core layer (1) to the shield layer (3). The option to planarize and remove the core materials by polishing down to the shield (3) or down to the underlying layer, e.g. top hard mask (14) is still valid, depending on the need to have a common shield for all the trenches or having each trench with its own shield independent electrically from the others shields formed in trenches within the same interconnect level.

A fifth embodiment of the first aspect illustrated in electrical equivalent scheme shown in FIG. 6a discloses the option of having at least two inputs (4, 4') from a higher or upper interconnect level connected to at least one output (5) to a lower interconnect level. Again this interconnect scheme can be manufactured both in single (SD) (FIGS. 6b–c) and in dual (DD) damascene architecture (FIG. 6d). However only one input at a time can be used. The other inputs go into a high-impedance state and are not affected by the signals applied to the common shield (2) and the core (1).

The sequence for implementation this fifth embodiment in the SD technology is identical to the one described in FIGS. 5b–5e resulting in the structure shown in FIG. 6b. Instead of having only one opening (24) formed in the insulator (2) to locally expose the shield (3), multiple openings are formed. As shown in FIG. 6c on top of the lower interconnect level (I) comprising the shielded interconnect a upper interconnect level (II) is formed. In the dielectric stack corresponding to this upper interconnect level the via (20') and trench (15') openings are already defined, each set of via and trench openings corresponding to a specific input (4, 4'). One could interrupt (23) the shield at either side of the lower via opening (20) in a process sequence outlined in FIGS. 5b–e.

The step sequence for implementing this embodiment in a DD technology is identical to the one described in FIGS. 5f–5l resulting in the structure shown in FIG. 6c. In a sixth embodiment of the first aspect, illustrated in FIGS. 7a–c, discloses the option of having a shield—shield connection between shields formed at stacked metal levels. This embodiment is illustrated by an implementation in a DD process sequence with the following process step sequence Via and Trench Opening (FIG. 7a)

The starting point illustrated in FIG. 7a is a substrate (9) on top of which a lower metal level (I) is formed comprising a shield conductor implemented in accordance with the embodiments illustrated by FIGS. 2a–f. The subsequent dielectric stack for the new metal level is deposited on top of the insulator (2) of the coaxial interconnect of the lower level (I) as shown in FIG. 7a. If no common shield is formed then the dielectric stack of the upper level (II) is formed directly on the shield (3) or on a hard mask layer if required. DD trenches (15) are formed in this subsequently deposited dielectric stack by using the top hard mask (14) as a masking layer. An opening (29) is formed exposing the shield layer (3) of the lower interconnect level (I). This opening can be optionally formed by stacking a trench and a via opening as is commonly done in DD technology. This opening (29) can be formed during the formation of the trench (15) or by first creating an opening in the second dielectric layer (13) before the trench is defined while the opening in the first dielectric layer (11) is formed simultaneously with the formation of the trench (15) in the second dielectric (13).

Shield Deposition (FIG. 7b)

The shield (3') of the upper coaxial interconnect is deposited as described in the text referred to FIG. 2b. The conductive layer is deposited uniformly over the surface also covering the sidewalls and bottom of both the trench (15) and via (29) opening. At the bottom of the via (29) this upper shield (3') is in direct electrical contact with the underlying shield layer (3).

Insulator Deposition (FIG. 7b)

The upper insulator (2') layer is deposited uniformly over the wafer as described in the text referred to FIG. 2c.

Core Deposition Planarization and Polishing (FIG. 7c)

The deposition of the core layer (17), planarization and polishing has been already disclosed in the text illustrated by FIGS. 2d–e and 2f–g. The core conductor (17) with its barrier (16) fills the trench opening (15) and the vias, including via (29). This stack of layers can be polished down to the shield layer (3') as shown in FIG. 7c or down to the top hard mask (14). The core layer (17) does not have any electrical function with respect to the shield (3)-shield (3') or interlevel shield connection. The core material only fills the opening (29) without being in contact with one of the shield layers (3, 3') or any other conductor.

In a seventh embodiment of this first aspect of the invention a method is disclosed for implementing shielded conductors selectively within an interconnect level comprising non-shielded conductors. This embodiment allows to implement shielded interconnections only for critical signal paths and where such coaxial interconnects are needed. The other conductors at this interconnect level remain unshielded and are standard damascene wiring lines. It is desirable that the shielded and not shielded conductors be electrically accessible from an upper interconnection level. FIGS. 8a–g illustrate a DD process sequence according to this embodiment.

Shielded Conductor Formation (FIG. 8a)

This process sequence starts with a interconnect layer comprising non shielded conductors (30). In FIG. 8a a trench is shown filled with the damascene metal stack of barrier layer (16) and metal (17). Normally an upper interconnect level would be formed on top of this lower interconnect level. In the present embodiment only a hard mask layer (31) is deposited uniformly over the planarized surface of the lower interconnect level. In this hard mask and in the dielectric stack underneath trenches (15) for receiving shielded conductors are opened by a litho-etch sequence in the areas where the non-shielded conductors (30) are absent. The shielded conductors are then formed according to the procedure described in the text illustrated by FIGS. 2a–g. The option of having the shield common to all the shielded conductors obtained with this step is used.

Dielectric Deposition and Patterning (FIG. 8b)

After the shielded conductors of the lower interconnect level (I) have been formed, the upper interconnect level (II) is created. Again a dielectric layer (11') and hard mask layer (12') are deposited on top of the lower interconnect level (I) and on top of the shielded interconnects. Optionally a bottom hard mask (10) can also be deposited. This stack of dielectric layers is then patterned to provide vias (20) for electrically connecting the shielded and unshielded conductors from the lower metal wiring to the upper metal level (II). These openings are aligned to the openings containing the conductors of the shielded and unshielded wiring and expose the metal of these wirings. In case an opening is formed to a shielded interconnect only a stack of dielectric layers (11',12') is to be etched. If an opening is formed to an unshielded interconnect, it is desirable that the shield (2) and insulator (3) of the shielded interconnect be removed. In the sidewalls of the latter openings the shield (2) remains exposed and would be in direct contact with a metal layer used to fill the openings to unshielded conductors during subsequent metallization.

Insulator Deposition and Etch (FIGS. 8c–d)

A new conformal layer of insulator (2') is deposited uniformly over the wafer as described in the text illustrated by FIG. 2c. An anisotropic dry etch process is applied leaving only spacers (32) of this conformal layer inside the via openings (20) adjacent to the sidewalls and removing essentially all the insulator material (2') from all other surfaces of the wafer and from the bottom of the via. The hard mask layer (12') protects the underlying dielectric stack during the spacer formation process.

Via Filling, Planarization and Polishing (FIG. 8e)

Via plugs (33) are formed by filing the vias (20) with a suitable conductor having good step coverage properties A CMP step removes this conductor layer (33) from the surface leaving it only in the vias (20). The hard mask layer (12') can be used as a polish stop layer. At the bottom of these vias (20) these plugs (33) are in direct electrical contact with the shielded and not shielded conductors of the lower metal level (I). Thanks to the presence of the sidewalls spacers (32) the via plug (33) remains insulated from the shield layer (2') when filling the via located on top of the non-shielded conductors (30). The plugs (33) formed in the openings above unshielded conductors are insulated from the shield (3) due to the presence of residual insulator (2) on the via sidewalls.

Dielectric Deposition and Patterning (FIG. 8f)

After filling the via (20) in the first dielectric (11") of the upper interconnect level (II) a second dielectric (13') and corresponding hard mask layer (14') is deposited and patterned to provide trenches (15'). These trenches outline the wiring pattern of the upper metal level (II). The via plugs (33) in the openings (20) formed in the first dielectric layer (11') connect this wiring of the upper metal level (II) to shielded and not shielded conductors of the lower interconnect level (I)

Damascene Non-shielded Metallization Formation (FIG. 8g)

The trenches (15') are filled by a SD metallization step that includes a barrier (16'), a conductor (17') deposition and CMP of this stack. This metallization sequence forms an interconnect network at the upper level (II) to have access to the shielded and not shielded conductors formed in the lower levels.

In a second aspect of the invention the materials used to create the shield (3) or the insulator (2) are not the standard damascene materials. In the first aspect conventional damascene technology was applied to implement the semi-coaxial interconnect scheme. The shield material e.g. could be of the same material as the barrier material used in a classic damascene technology and is also capable of preventing diffusion of the core metal into the IMD layer. In principle however any other suitable conductor can be used, even without having barrier properties. The intermediate dielectric could for example have barrier properties against Cu diffusion. Table 2 summarizes the various combinations of the shield, the insulator and the core material. A barrier will be deposited on top of the intermediate dielectric before forming the copper core layer because in case of dual damascene technology in the vias there will always be a contact between an portion of the shield and the core.

In a third aspect of the invention a damascene interconnect scheme to provide a coaxial interconnect scheme between chips. In the previous aspects the coaxial interconnect was formed in to connect building blocks belonging to the same integrated circuit leading to an intrachip connection. This third aspect outlines the use of a damascene based coaxial interconnect scheme to connect building blocks belonging to different chips present on a same substrate, resulting in a interchip connection. A trend in state-of-the-art submicron-electronics is to integrate as much as possible all functionality on a single substrate carrying multiple chips, Preferably this integration of multiple chips is done in a single package.

Such a single substrate could be a semiconductor wafer as used in wafer-scale packaging. In standard semiconductor processing all dies are processed in parallel and finally diced to yield individual chips. These chips can then optionally be packaged and combined e. g. on the MCM substrate. In wafer level packaging however an interconnect scheme is established to connect chips formed on the semiconductor substrate prior to the step of dicing the wafer into individual chips or sets of chips. FIGS. 9a–b are an illustration of this embodiment. On a substrate (9), e. g. a Si wafer, a plurality of chips (34) is formed by parallel processing. The dashed lines outline a matrix of 4 chips on this substrate. Each chip can have its own functionality. After forming bond pads (35) on the individual chips (34), the wafer is covered with a so-called passivation or protective layer (36), e.g. 1000 nm of PECVD deposited silicon nitride. Optionally this passivation layer can be patterned to expose the bonding pads (35). As shown in FIG. 9b, which is a cross-sectional part of FIG. 9a along the line AA, a dielectric layer (37) or stack of layers is then formed uniformly over the wafer. This dielectric layer can be a PECVD layer such as an oxide or a spin-on-dielectric such as BCB from Dow Corning. In this dielectric layer (37) openings, i.e. via (38) and trenches (39) can be defined to yield a damascene based interconnect scheme. These openings are then filled with metal to obtain a shielded interconnect as outlined in the embodiments of the previous aspects. In this example a shielded interconnect is formed between selected bond pads of chips, yielding an inter-chip shielded interconnect. Within each chip the intra-chip shielded interconnect can further propagate the high speed signal to the various modules of this chip. Additional layers can be deposited in order to improve the damascene process, e.g. hard mask layers to provide selectivity in the etching of the dielectric layers and in the polishing processes of dielectric and metal layers. Such a single substrate (9) could be a Multi-Chip-Module (MCM) carrier made of glass, ceramic or other substrate materials applicable in MCM technology. In the international application WO 00/45420 hereby incorporated in its entirety by reference such an MCM for integrated RF capabilities is disclosed. Consequently such chips must be processed and designed such that they are able to handle high frequency signals and communicate these signals in between them. The interconnecting scheme on this MCM substrate will therefore encounter the problems mentioned above and has to take care of them. In state-of-the-art MCM technologies an interconnect scheme is formed by subsequently depositing dielectric layers, e.g. by spin coating BCB, and by forming patterned metal layers. These patterned metal layers are formed by a subtractive technology: or a layer is e.g. plasma sputtered (PVD) and subsequently etched or a seedlayer is patterned and the desired metal layer is plated on top of this patterned seed layer. No damascene interconnect technology for MCM applications is used so far now. The methods described in the above embodiments are also applicable to form a shielded interconnect scheme on a MCM carrier based on a damascene interconnect technology.

Tables and Drawings

Drawings: see separate file

TABLE 1 overview of the process steps according to a preferred embodiment

| Step | Description | Thickness | Description |
|---|---|---|---|
| | Conventional damascene formation | | |
| 1 | Nitride deposition | 50 nm | Bottom hard mask (10) Prevents copper contamination of the substrate and is deposited on both sides of the wafer Removed from the backside during further processing |

TABLE 1-continued overview of the process steps according to a preferred embodiment

| Step | Description | Thickness | Description |
|---|---|---|---|
| 2 | Oxide deposition | 500 nm | First dielectric layer (11) In this layer normally the openings (15) for vias an contact are etched in a single damascene run. These openings are not etched for this test. |
| 3 | SiC + SiOC | 100 nm | Intermediate hard mask (12) Endpoint layer for trench etch |
| 4 | Oxide deposition | 600 nm | Second dielectric layer (13) Insulating layer between trenches, can be a low-K dielectric |
| 5 | Trench patterning | | W: 0.3 to 2.0 um and S: 10 um to 0.3 um |
| | Coaxial elements: formation of shield and insulator | | |
| 6 | Ti-TiN/TaN shield deposition | 15– nm 40/50 | Shield layer (3) 2 different shield materials are tested |
| 7 | SiC deposition | 50/100/ nm 150 | Insulator layer (2) 3 different insulator thickness are tested |
| | Conventional damascene metallization: formation of the core | | |
| 8 | TaN barrier deposition | 10 nm | Barrier layer (15) To prevent Cu (17)- SiC (2) adhesion problems during CMP |
| 9 | Cu seed | 150 nm | Standard Cu seed layer |
| 10 | Cu plating | 1000 nm | Copper layer (17) Standard CU plating |
| 11 | Cu RTP | | Rapid Thermal processing to stabilize the plated copper layer |
| 12 | Cu CMP | | Timed polish step until the shield layer (3) is exposed |

TABLE 2 overview of the barrier diffusion properties of the composing layers of the shielded interconnect according to an embodiment

| Layer/layer function | Combination #1 | Combination #2 | Combination #3 |
|---|---|---|---|
| shield | barrier | no barrier | no barrier |
| insulator | no barrier | no barrier | barrier |
| Core | Cu + barrier | Cu + barrier | Cu + barrier |

TABLE 3 overview of the numerals used in the drawings.

| Numeral | definition |
|---|---|
| 1, 1' | Core of a coaxial interconnect, inner conductor |
| 2, 2' | Insulator of a coaxial interconnect, in between core and shield, intermediate dielectric |
| 3, 3' | Shield of a coaxial interconnect, outer conductor |
| 4, 4' | Signal source, input of coaxial line |
| 5, 5' | Load side, output of coaxial line |
| 6 | Coaxial conductor, comprising core (1), insulator (2), shield (3) |
| 7 | Sidewalls of an opening (15) formed in SD or DD stack |

TABLE 3-continued overview of the numerals used in the drawings.

| Numeral | definition |
|---|---|
| 8 | Bottom of an opening (15) formed in SD or DD stack |
| 9 | Substrate on which a SD or DD stack is formed |
| 10 | Bottom hard mask of a damascene stack |
| 11 | First dielectric layer of a damascene stack |
| 12 | Intermediate hard mask of a damascene stack |
| 13 | Second dielectric layer of a damascene stack |
| 14 | Top hard mask of a damascene stack |
| 15, 15' | Opening formed in a SD or DD stack |
| 16, 16' | Diffusion barrier layer used in a damascene metallization process |
| 17, 17' | Metal layer used in damascene metallization process, optionally comprising a seed layer |
| 18 | Second insulator layer of triaxial interconnect in between the shield (3) and guard (19) |
| 19 | Guard of a triaxial interconnect, third conductor |
| 20 | Via opening |
| 21 | Lower metallization level |
| 22 | Opening of the shield (3) above the via opening (20) |
| 23 | Interruption of the shield (3) inside the trench opening (15) |
| 24 | Opening of the insulator (2) forming a passageway between core (1) and shield (2) |
| 25 | Opening of the insulator (2) forming a passageway between the core (1) and the via plug |
| 26 | Residual shield material in via opening (20) |
| 27 | Sidewall of the via opening (20) |
| 28 | Bottom of the via opening (20) |
| 29 | DD opening extending throughout the DD stack, optionally formed by stacking a trench (15) and a via (20) opening |
| 30 | Unshielded damascene interconnect or wire |
| 31 | Additional top hard mask layer |
| 32 | Sidewall insulator spacer formed inside the via (20) |
| 33 | Metal layer |
| 34 | Chip in a matrix of chip formed on a substrate (9) |
| 35 | Bonding pad |
| 36 | Passivation layer |
| 37 | Wafer level dielectric |
| 38 | Openings in this wafer level dielectric (37) |
| 39 | Wiring and interconnect lines formed in this wafer level dielectric (37) |
| I, II | Interconnect level |

What is claimed is:

1. A method of forming a shielded interconnect on a substrate covered with a stack, the method comprising the steps of:

forming an opening in the stack on the substrate, the substrate comprising at least one active device and the stack comprising at least one insulation layer covering the substrate, wherein the opening is formed at a level above the at least one active device;

depositing a first conductive layer over the stack;

depositing a first dielectric layer over the first conductive layer;

depositing a second conductive layer over the first dielectric layer, and polishing the substrate until at least a portion of the stack is exposed.

2. The method of claim 1, further comprising depositing a barrier layer between the first dielectric layer and the second conductive layer.

3. The method of claim 1, wherein the step of forming an opening includes patterning a trench for a core damascene metal stack.

4. The method of claim 1, wherein the step of forming an opening includes forming a trench having a bottom portion and two sidewalls, wherein the thickness of the first conductive layer in the bottom portion and two sidewalls is substantially the same.

5. The method of claim 1, wherein the step of depositing a first conductive layer includes depositing at least one of a metal and metal alloy, formed by sputtering, plasma vapor deposition (PVD), and/or chemical vapor deposition (CVD).

6. The method of claim 1, wherein the step of depositing a first conductive layer includes depositing a conductive shield layer having a thickness in the range of 50 to 500 nanometers.

7. The method of claim 1, wherein the step of depositing the first dielectric layer includes depositing a layer comprising at least one of silicon, oxide, nitride, and carbide layers.

8. The method of claim 1, wherein the step of depositing the first dielectric layer includes depositing an insulation layer having a thickness in the range of 10 to 500 nanometers.

9. The method of claim 1, wherein the step of depositing the second conductive layer includes depositing a core layer comprising copper.

10. The method of claim 1, wherein said stack further comprises a first hard mask layer located under the first conductive layer, a second dielectric layer located under the first hard mask layer, a second hard mask layer located under the second dielectric layer, and a third dielectric layer located under the second hard mask layer.

11. The method of claim 10, wherein the step of polishing the substrate comprises exposing at least one of the second dielectric layer or the first hard mask layer of the substrate.

12. The method of claim 1, further comprising confining the first dielectric layer and second conductor layer to within the opening in the stack of the substrate.

13. A shielded interconnect formed on a substrate covered with a stack comprising the shielded interconnect being manufactured by a method comprising the steps of:

forming an opening in the stack on the substrate, the substrate comprising at least one active device and the stack comprising at least one insulation layer covering the substrate, wherein the opening is formed at a level above the at least one active device;

depositing a first conductive layer over the stack;

depositing a dielectric layer over the first conductive layer;

depositing a second conductive layer over the dielectric layer, and polishing the substrate until at least a portion of the stack is exposed.

14. A shielded interconnect, comprising:

a first conductive layer deposited in an opening of a stack comprising at least one insulating layer and formed on a substrate comprising at least one active device, wherein the opening is at a level above the at least one active device;

a dielectric layer deposited over the first conductive layer; and a second conductive layer deposited over the dielectric layer, wherein at least a portion of the stack is exposed.

15. The shielded interconnect of claim 14, further comprising a barrier layer deposited between the dielectric layer and the second conductive layer.

16. The shielded interconnect of claim 14, wherein the opening comprises a trench patterned in the stack for a core damascene metal stack.

17. The shielded interconnect of claim 14, wherein the opening is defined by a bottom portion and two sidewalls, and wherein the thickness of the first conductive layer in the bottom portion and two sidewalls is substantially the same.

18. The shielded interconnect of claim 14, wherein the first conductive layer comprises at least one of a metal and metal alloy, formed by sputtering, plasma vapor deposition (PVD), and/or chemical vapor deposition (CVD).

19. The shielded interconnect of claim 14, wherein the exposed portion includes at least one of a dielectric layer or a hard mask layer of the substrate.

20. The shielded interconnect of claim 14, wherein the dielectric layer and second conductor layer are confined to within the opening in the stack of the substrate.

* * * * *